(12) United States Patent
Taylor et al.

(10) Patent No.: US 7,598,601 B2
(45) Date of Patent: Oct. 6, 2009

(54) CURRENT SENSOR

(75) Inventors: William P. Taylor, Amherst, NH (US); Michael C. Doogue, Manchester, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 0 days.

(21) Appl. No.: 12/171,651

(22) Filed: Jul. 11, 2008

(65) Prior Publication Data

US 2008/0297138 A1 Dec. 4, 2008

Related U.S. Application Data

(63) Continuation of application No. 11/383,021, filed on May 12, 2006, now abandoned, which is a continuation-in-part of application No. 11/401,160, filed on Apr. 10, 2006, now Pat. No. 7,476,816, which is a continuation-in-part of application No. 11/336,602, filed on Jan. 20, 2006, now Pat. No. 7,075,287, which is a continuation-in-part of application No. 11/144,970, filed on Jun. 3, 2005, now Pat. No. 7,166,807, which is a continuation-in-part of application No. 11/140,250, filed on May 27, 2005, now Pat. No. 6,995,315, which is a continuation-in-part of application No. 10/649,450, filed on Aug. 26, 2003.

(51) Int. Cl.
*H01L 23/495* (2006.01)
(52) U.S. Cl. ............................. 257/666; 257/E43.003; 257/E27.005; 174/536; 324/117 H
(58) Field of Classification Search ................ 257/666, 257/673, 676, E27.005, E43.002, E43.003, 257/E43.007; 174/529, 527; 324/117 H
See application file for complete search history.

(56) References Cited

U.S. PATENT DOCUMENTS 4,893,073 A 1/1990 McDonald et al.

(Continued)

FOREIGN PATENT DOCUMENTS

DE 4 141 386 A1 6/1993

(Continued)

OTHER PUBLICATIONS

PCT Search Report and Written Opinion of the ISA for PCT/US2004/009908 dated Aug. 16, 2004.

(Continued)

*Primary Examiner*—Brook Kebede
(74) *Attorney, Agent, or Firm*—Daly, Crowley, Mofford & Durkee, LLP

(57) ABSTRACT

An integrated circuit current sensor includes a lead frame having at least two leads coupled to provide a current conductor portion, and a substrate having a first surface in which is disposed one or more magnetic field sensing elements, with the first surface being proximate to the current conductor portion and a second surface distal from the current conductor position. In one particular embodiment, the substrate is disposed having the first surface of the substrate above the current conductor portion and the second surface of the substrate above the first surface. In this particular embodiment, the substrate is oriented upside-down in the integrated circuit in a flip-chap arrangement. The current sensor can also include an electromagnetic shield disposed between the current conductor portion and the magnetic field sensing elements.

25 Claims, 24 Drawing Sheets

U.S. PATENT DOCUMENTS

| | | | |
|---|---|---|---|
| 5,041,780 A | 8/1991 | Rippel | |
| 5,124,642 A | 6/1992 | Marx | |
| 5,247,202 A | 9/1993 | Popovic et al. | |
| 5,442,228 A | 8/1995 | Pham et al. | |
| 5,561,366 A | 10/1996 | Takahashi et al. | |
| 5,615,075 A | 3/1997 | Kim | |
| 6,005,383 A | 12/1999 | Savary et al. | |
| 6,150,714 A | 11/2000 | Andreycak et al. | |
| 6,252,389 B1 | 6/2001 | Baba et al. | |
| 6,316,931 B1 | 11/2001 | Nakagawa et al. | |
| 6,323,634 B1 | 11/2001 | Nakagawa et al. | |
| 6,356,068 B1 | 3/2002 | Steiner et al. | |
| 6,411,078 B1 | 6/2002 | Nakagawa et al. | |
| 6,424,018 B1 | 7/2002 | Ohtsuka | |
| 6,445,171 B2 | 9/2002 | Sandquist et al. | |
| 6,462,531 B1 | 10/2002 | Ohtsuka | |
| 6,545,456 B1 | 4/2003 | Radosevich et al. | |
| 6,566,856 B2 | 5/2003 | Sandquist et al. | |
| 6,642,705 B2 | 11/2003 | Kawase | |
| 6,667,682 B2 | 12/2003 | Wan et al. | |
| 6,683,448 B1 | 1/2004 | Ohtsuka | |
| 6,727,683 B2 | 4/2004 | Goto et al. | |
| 6,759,841 B2 | 7/2004 | Goto et al. | |
| 6,781,359 B2 * | 8/2004 | Stauth et al. | 324/117 H |
| 6,791,313 B2 | 9/2004 | Ohtsuka | |
| 6,812,687 B1 | 11/2004 | Ohtsuka | |
| 6,841,989 B2 * | 1/2005 | Goto et al. | 324/117 H |
| 6,867,573 B1 | 3/2005 | Carper | |
| 6,921,955 B2 | 7/2005 | Goto et al. | |
| 6,989,665 B2 | 1/2006 | Goto et al. | |
| 6,995,315 B2 | 2/2006 | Sharma et al. | |
| 7,006,749 B2 | 2/2006 | Illich et al. | |
| 7,075,287 B1 | 7/2006 | Mangtani et al. | |
| 7,166,807 B2 | 1/2007 | Gagnon et al. | |
| 7,248,045 B2 | 7/2007 | Shoji | |
| 7,259,545 B2 | 8/2007 | Stauth et al. | |
| 7,348,724 B2 | 4/2008 | Taylor et al. | |
| 2001/0028115 A1 | 10/2001 | Yanagawa et al. | |
| 2002/0179987 A1 | 12/2002 | Meyer et al. | |
| 2005/0045359 A1 | 3/2005 | Doogue et al. | |
| 2005/0230843 A1 | 10/2005 | Williams | |
| 2006/0002147 A1 | 1/2006 | Hong et al. | |
| 2006/0071655 A1 | 4/2006 | Shoji | |
| 2006/0091993 A1 | 5/2006 | Shoji | |
| 2006/0114098 A1 | 6/2006 | Shoji | |
| 2006/0145690 A1 | 7/2006 | Shoji | |
| 2006/0170529 A1 | 8/2006 | Shoji | |
| 2006/0181263 A1 | 8/2006 | Doogue et al. | |
| 2006/0219436 A1 | 10/2006 | Taylor et al. | |
| 2006/0291106 A1 | 12/2006 | Shoji | |
| 2007/0044370 A1 | 3/2007 | Shoji | |
| 2007/0076332 A1 | 4/2007 | Shoji | |
| 2007/0090825 A1 | 4/2007 | Shoji | |
| 2007/0096716 A1 | 5/2007 | Shoji | |
| 2007/0188946 A1 | 8/2007 | Shoji | |
| 2007/0279053 A1 | 12/2007 | Taylor et al. | |
| 2009/0058412 A1 | 3/2009 | Taylor et al. | |

FOREIGN PATENT DOCUMENTS

| | | |
|---|---|---|
| DE | 4 141 386 C2 | 6/1993 |
| EP | 0 867 725 A1 | 9/1998 |
| EP | 1 107 327 A2 | 6/2001 |
| EP | 1 107 328 A2 | 6/2001 |
| EP | 1 111 693 A2 | 6/2001 |
| EP | 1 180 804 A2 | 2/2002 |
| JP | 61-71649 | 4/1986 |
| JP | 04-364472 | 12/1992 |
| JP | 2000174357 | 6/2000 |
| JP | 2001165963 | 6/2001 |
| JP | 2001174486 | 6/2001 |
| JP | 2001221815 | 8/2001 |
| JP | 2001230467 | 8/2001 |
| JP | 2001339109 | 12/2001 |
| JP | 2002026419 | 1/2002 |
| JP | 2002202326 | 7/2002 |
| JP | 2002202327 | 7/2002 |
| WO | WO 99/14605 | 3/1999 |
| WO | WO 2005/026749 A1 | 3/2005 |
| WO | WO 2006/130393 | 12/2006 |

OTHER PUBLICATIONS

PCT Search Report and Written Opinion of the ISA for PCT/US2006/019953 dated Sep. 25, 2006.

Mosbarger et al.; "The Effects of Materials and Post-Mold Profiles on Plastic Encapsulated Integrated Circuits;" IEEE/IRPS; Apr. 1994; pp. 93-100.

Steiner, et al.; "Fully Packaged CMOS Current Monitor Using Lead-on-Chip Technology;" Physical Electronics Laboratory, ETH Zurich, CH8093 Zurich, Switzerland; No. 0-7803-4412-X/98; IEEE 1998; pp. 603-608.

File downloaded from PAIR for U.S. Appl. No. 11/383,021, filed May 23, 2006, Image File Wrapper through Jan. 15, 2009, Part 1 of 2, 315 pages.

File downloaded from PAIR for U.S. Appl. No. 11/383,021, filed May 23, 2006, Image File Wrapper through Jan. 15, 2009, Part 2 of 2, 1-293 pages.

File downloaded from PAIR for U.S. Appl. No. 11/776,242, filed Jul. 11, 2007, Image File Wrapper through Feb. 9, 2009, 540 pages.

Chinese Office Action for Chinese National Stage Application No. CN 2004 80024296.5 dated Apr. 29, 2009 (PCT/US2004/009908).

Chinese Office Action for Chinese National Stage Application No. CN 2004 80024296.5 dated Sep. 26, 2008 (PCT/US2004/009908).

Chinese Office Action for Chinese National Stage Application No. CN 2004 80024296.5 dated May 6, 2008 (PCT/US2004/009908).

Chinese Office Action for Chinese National Stage Application No. CN 2004 80024296.5 dated Nov. 23, 2007 (PCT/US2004/009908).

European Office Action for European National Stage Application No. EP 04816162.4 dated Jan. 2, 2008 (PCT/US2004/009908).

European Office Action for European National Stage Application No. EP 04816162.4 dated Jun. 27, 2007 (PCT/US2004/009908).

Japanese Final Office Action for Japanese National Stage Application No. JP 2006-524610 dated Apr. 23, 2009 (PCT/US2004/009908).

Japanese Office Action for Japanese National Stage Application No. JP 2006-524610 dated Sep. 10, 2008 (PCT/US2004/009908).

Japanese Office Action for Japanese National Stage Application No. JP 2006-524610 dated Jul. 10, 2008 (PCT/US2004/009908).

* cited by examiner

CURRENT SENSOR

CROSS-REFERENCE TO RELATED APPLICATIONS

This application is a Continuation application of and claims the benefit under 35 U.S.C. §120 of U.S. application Ser. No. 11/383,021 filed on May 12, 2006 now abandoned, which application is a Continuation-in-Part application of and claims the benefit under 35 U.S.C. §120 of U.S. application Ser. No. 11/401,160 filed on Apr. 10, 2006 now U.S. Pat. No. 7,476, 816, which is a Continuation-in-Part application of and claims the benefit under 35 U.S.C. §120 of U.S. application Ser. No. 11/336,602 filed on Jan. 20, 2006 (now U.S. Pat. No. 7,075,287, issued on Jul. 11, 2006), which is a Continuation-in-Part application of and claims the benefit under 35 U.S.C. §120 of U.S. application Ser. No. 11/144,970 filed on Jun. 3, 2005 (now U.S. Pat. No. 7,166,807, issued on Jan. 23, 2007), which is a Continuation-in-Part application of and claims the benefit under 35 U.S.C. §120 of U.S. application Ser. No. 11/140,250 filed on May 27, 2005 (now U.S. Pat. No. 6,995,315, issued Feb. 7, 2006), which is a Continuation-in-Part application of and claims the benefit under 35 U.S.C. §120 of U.S. application Ser. No. 10/649,450 filed on Aug. 26, 2003, which applications are incorporated herein by reference in their entirety.

STATEMENT REGARDING FEDERALLY SPONSORED RESEARCH

Not Applicable.

FIELD OF THE INVENTION

This invention relates generally to electrical current sensors, and more particularly to a miniaturized current sensor in an integrated circuit package.

BACKGROUND OF THE INVENTION

As is known in the art, one type of conventional current sensor uses a magnetic field transducer (for example a Hall effect or magnetoresistive transducer) in proximity to a current conductor. The magnetic field transducer generates an output signal having a magnitude proportional to the magnetic field induced by a current that flows through the current conductor.

Some typical Hall effect current sensors include a gapped toroid magnetic flux concentrator, with the Hall effect element positioned in the toroid gap. The Hall effect device and toroid are assembled into a housing, which is mountable on a printed circuit board. In use, a separate current conductor, such as a wire, is passed through the center of the toroid. Such devices tend to be undesirably large, both in terms of height and circuit board area.

Other Hall effect current sensors include a Hall effect element mounted on a dielectric material, for example a circuit board. One such current sensor is described in a European Patent Application No. EP0867725. Still other Hall effect current sensors include a Hall effect element mounted on a substrate, for example a silicon substrate as described in a European Patent Application No. EP 1111693.

Various parameters characterize the performance of current sensors, including sensitivity and linearity. Sensitivity is related to the magnitude of a change in output voltage from the Hall effect transducer in response to a sensed current. Linearity is related to the degree to which the output voltage from the Hall effect transducer varies in direct proportion to the sensed current.

The sensitivity of a current sensor is related to a variety of factors. One important factor is the flux concentration of the magnetic field generated in the vicinity of the current conductor and sensed by the Hall effect element. For this reason, some current sensors use a flux concentrator. Another important factor, in particular for a current sensor in which a flux concentrator is not used, is the physical separation between the Hall effect element and the current conductor.

SUMMARY OF THE INVENTION

In accordance with the present invention, a current sensor includes a lead frame having a plurality of leads. A first current conductor portion includes at least two of the plurality of leads. The current sensor also includes a substrate having first and second opposing surfaces.

The first surface is proximate to the first current conductor portion and the second surface is distal from the first current conductor portion. The current sensor also includes one or more magnetic field transducers disposed on the first surface of said substrate, and an electromagnetic shield disposed proximate to the one or more magnetic field transducers and between the first surface of the substrate and the first current conductor portion. The electromagnetic shield has at least one feature selected to reduce an eddy current induced in the electromagnetic shield.

In accordance with another aspect of the present invention, a current sensor includes a lead frame having a plurality of leads, and a substrate having first and second opposing surfaces. One or more magnetic field transducers are disposed on the first surface of the substrate. The current sensor also includes an electromagnetic shield disposed proximate to the one or more magnetic field transducers. The electromagnetic shield has at least one feature selected to reduce an eddy current induced in the electromagnetic shield.

BRIEF DESCRIPTION OF THE DRAWINGS

The foregoing features of the invention, as well as the invention itself may be more fully understood from the following detailed description of the drawings, in which:

FIG. 9A is a cross-sectional view of an alternate embodiment of the current conductor portion of FIG. 9;

DETAILED DESCRIPTION OF THE INVENTION

Figure 1:
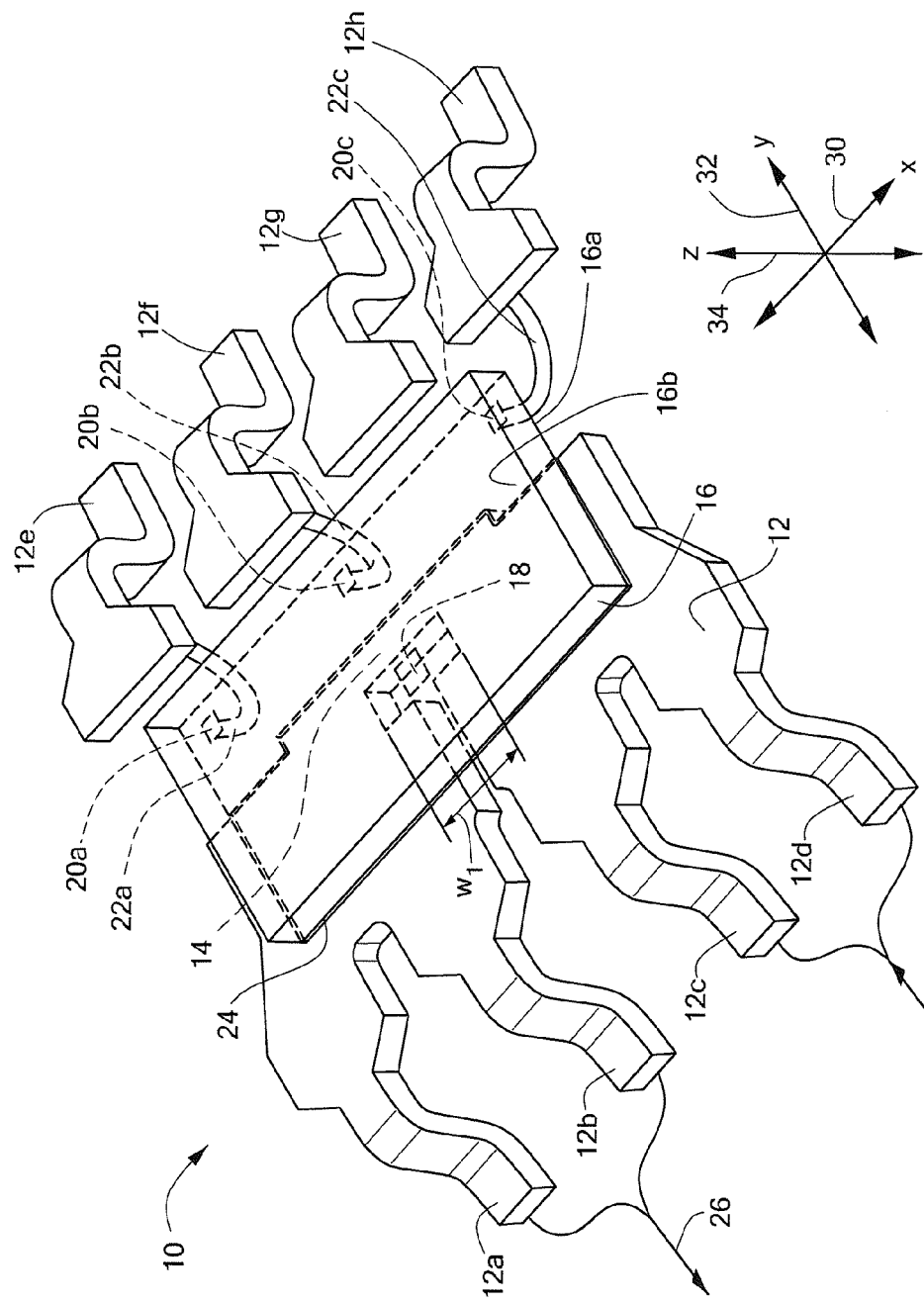
FIG. 1 is an isometric view of a current sensor in accordance with the present invention.

Referring to FIG. 1, an exemplary current sensor 10 in accordance with the present invention includes a lead frame 12 having a plurality of leads 12a-12h. The leads 12a and 12b are coupled to the leads 12c and 12d to form a current path, or current conductor with a narrow portion 14 having a width w1. The current sensor 10 also includes a substrate 16 having a first surface 16a and a second, opposing surface 16b. The substrate 16 has a magnetic field transducer 18 which, in some embodiments, can be a Hall effect element 18, diffused into the first surface 16a, or otherwise disposed on the first surface 16a. The substrate 16 can be comprised of a semiconductor material, e.g., silicon, or, in an alternate embodiment, the substrate 16 can be comprised of an insulating material.

The substrate 16 is disposed above the lead frame 12 so that the first surface 16a is proximate to the current conductor portion 14 and the second surface 16b is distal from the current conductor portion 14 and more specifically, so that the Hall effect element 18 is in close proximity to the current conductor portion 14. In the illustrated embodiment, the substrate 16 has an orientation that is upside down (i.e., the first surface 16a is directed downward) relative to a conventional orientation with which a substrate is mounted in an integrated circuit package.

The substrate 16 has bonding pads 20a-20c on the first surface 16a, to which bond wires 22a-22c are coupled. The bond wires are further coupled to the leads 12e, 12f, 12h of the lead frame 12.

An insulator 24 separates the substrate 16 from the lead flame 12. The insulator 24 can be provided in a variety of ways. For example, in one embodiment, a first portion of the insulator 24 includes a four μm thick layer of a BCB resin material deposited directly on the first surface 16a of the substrate 16. A second portion of the insulator 24 may include a layer of underfill material, for example Staychip™ NUF-2071 E (Cookson Electronics Equipment, New Jersey), deposited on the lead frame 12. Such an arrangement provides more than one thousand volts of isolation between the substrate 16 and the lead frame 12.

It will be understood that the current conductor portion 14 is but a pair of the total path through which an electrical current flows. For example, a current having a direction depicted by arrows 26 flows into the leads 12c, 12d, which are here shown to be electrically coupled in parallel, through the current conductor portion 14, and out of the leads 12a, 12b, which are also shown here to be electrically coupled in parallel.

With this arrangement, the Hall effect element 18 is disposed in close proximity to the current conductor portion 14 and at a predetermined position relative to the conductor portion 14, such that a magnetic field generated by an electrical current passing though the current conductor portion 14, in a direction shown by arrows 26, is in a direction substantially aligned with a maximum response axis of the Hall effect element 18. The Hall effect element 18 generates a voltage output proportional to the magnetic field and therefore proportional to the current flowing through the current conductor portion 14. The illustrated Hall effect element 18 has a maximum response axis substantially aligned with a z-axis 34. Because the magnetic field generated in response to the current is circular about the current conductor portion 14, the Hall effect element 18 is disposed just to the side (i.e., slightly offset along a y-axis 32) of the current conductor portion 14, as shown, where the magnetic field is pointed substantially along the z-axis 34. This position results in a greater voltage output from the Hall effect element 18, and therefore improved sensitivity. However, a Hall effect element, or another type of magnetic field sensor, for example a magnetoresistance element, having maximum response axis aligned in another direction, can be disposed at another position relative to the current conductor portion 14, for example, on top of the current conductor portion 14 (in a direction along z-axis 34).

Figure 3:
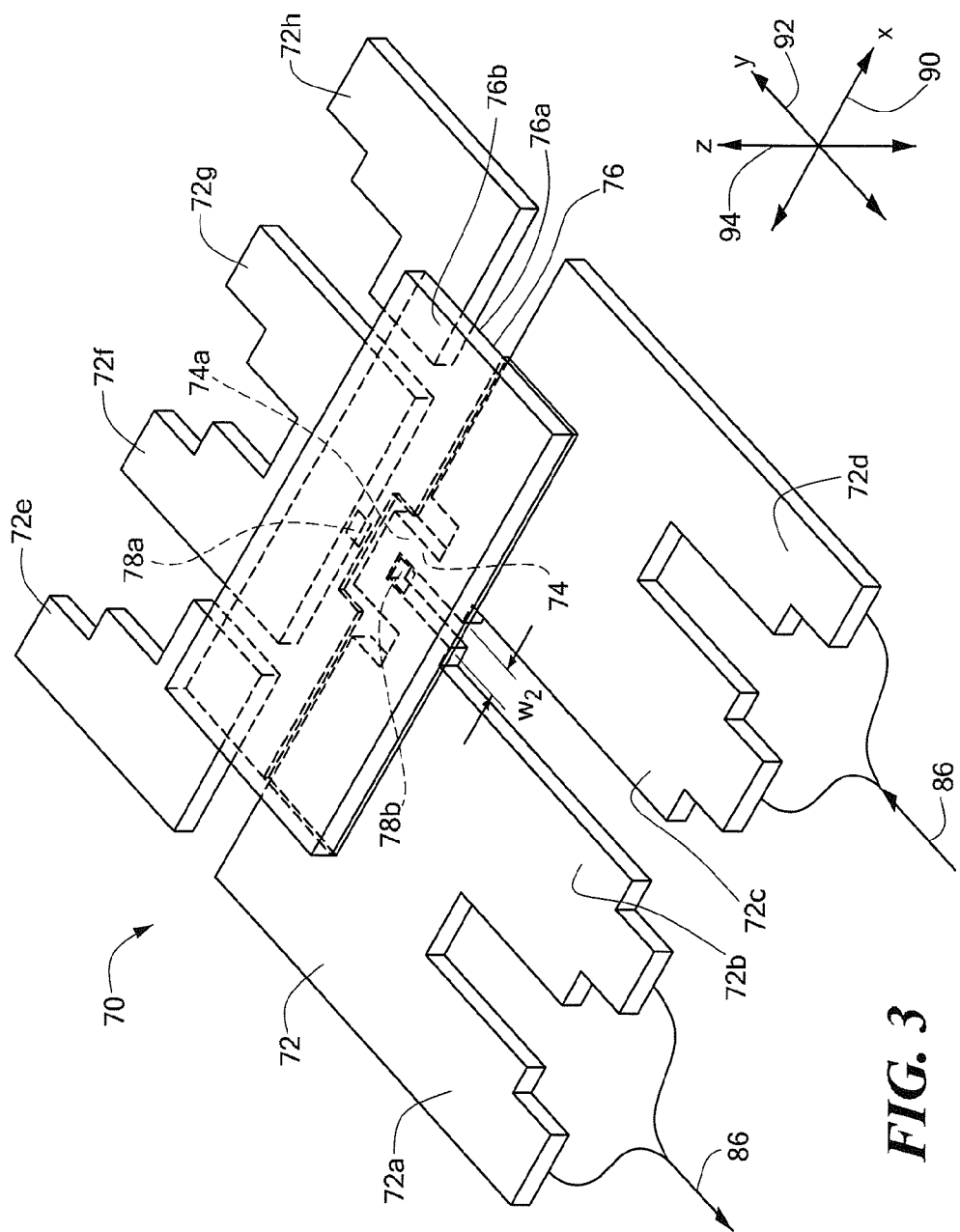
FIG. 3 is an isometric view of another embodiment of a current sensor in accordance with the present invention.
Figure 4:
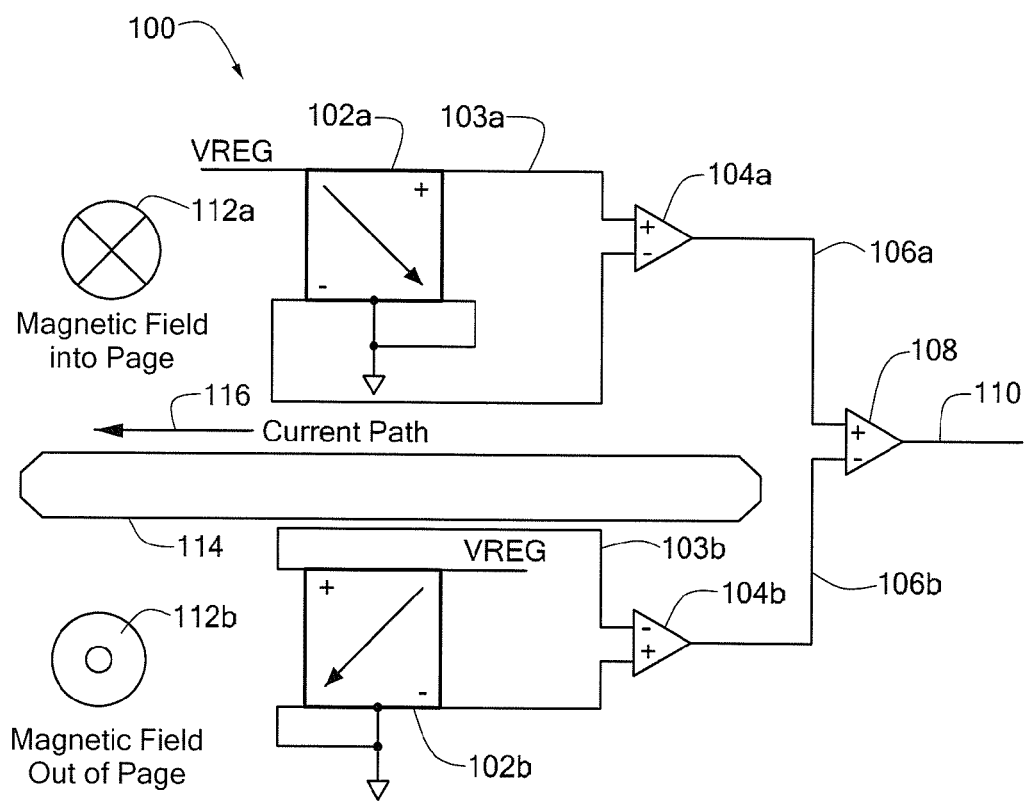
FIG. 4 is a schematic of a circuit forming part of the current sensor of FIG. 3.
Figure 5:
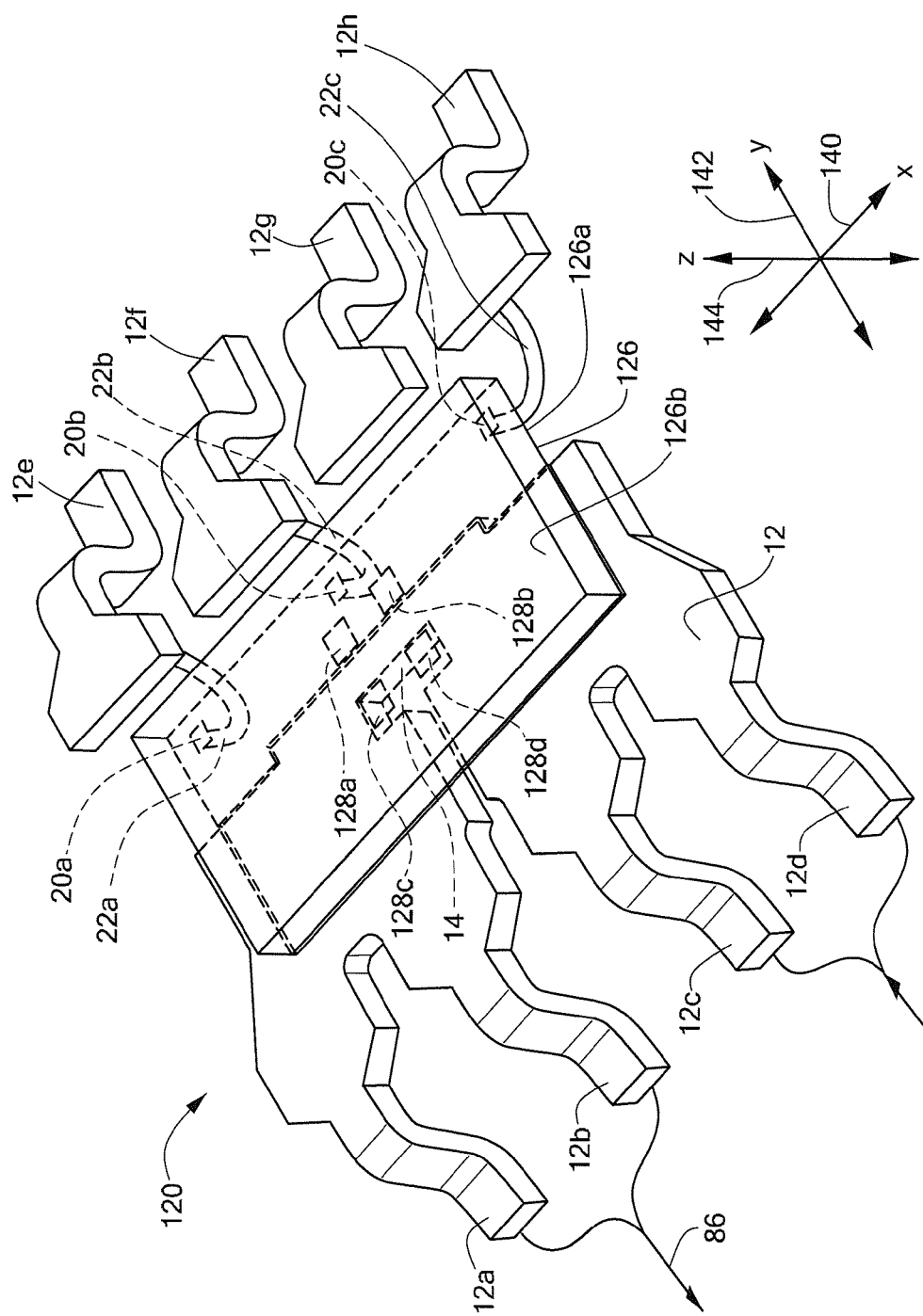
FIG. 5 is an isometric view of yet another embodiment of a current sensor in accordance with the present invention.

While one Hall effect element 18 is shown on the first surface 16a of the substrate 16, it will be appreciated that more than one Hall effect element can be used, as shown in the embodiments of FIGS. 3 and 5. Also, additional circuitry, for example an amplifier, can also be diffused in or otherwise disposed on, or supported by the first and/or second surfaces 16a, 16b of the substrate 16. Exemplary circuitry of this type is shown in FIG. 4.

Figure 7:
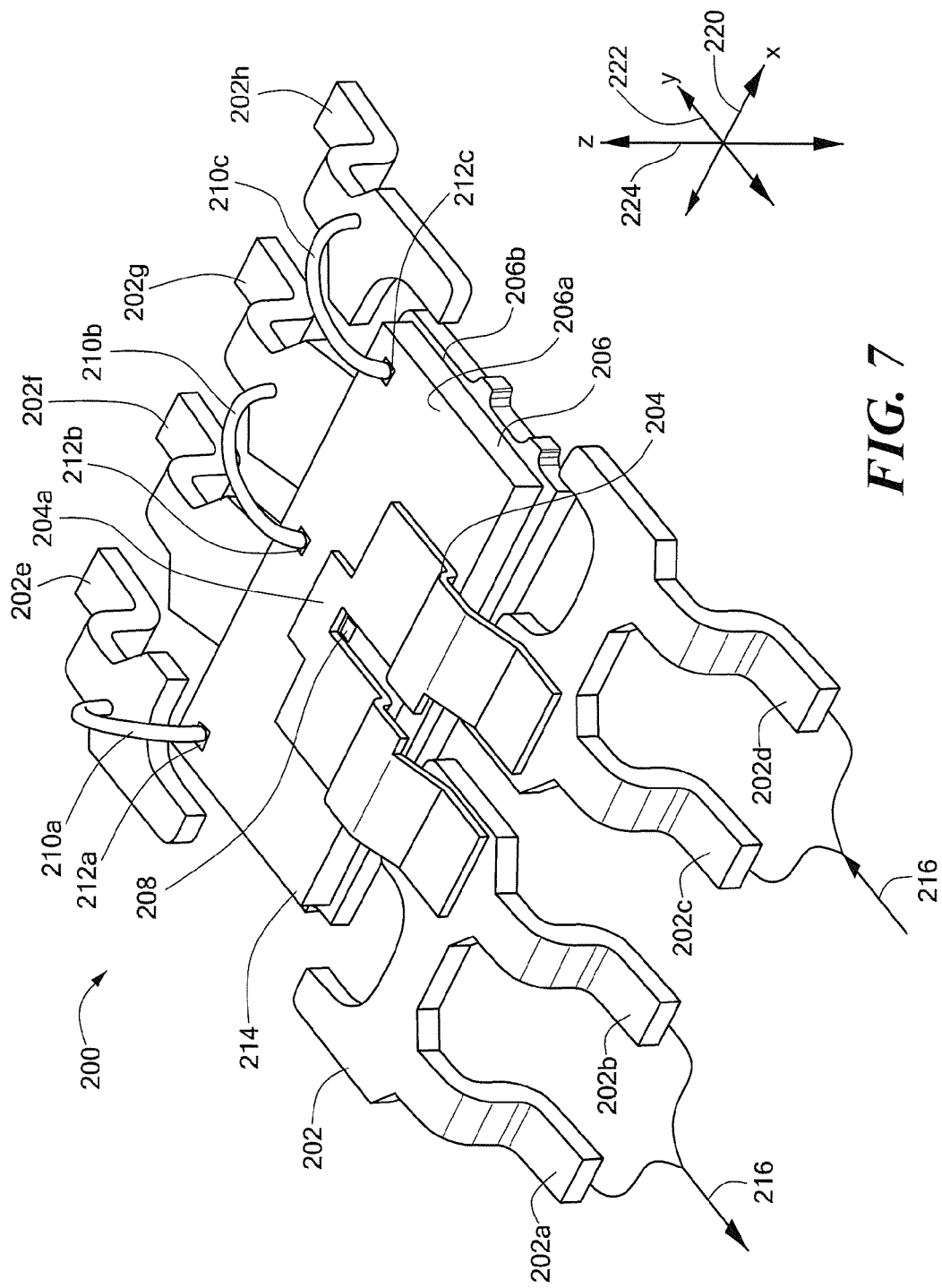
FIG. 7 is an isometric view of still another embodiment of a current sensor in accordance with the present invention.
Figure 8:
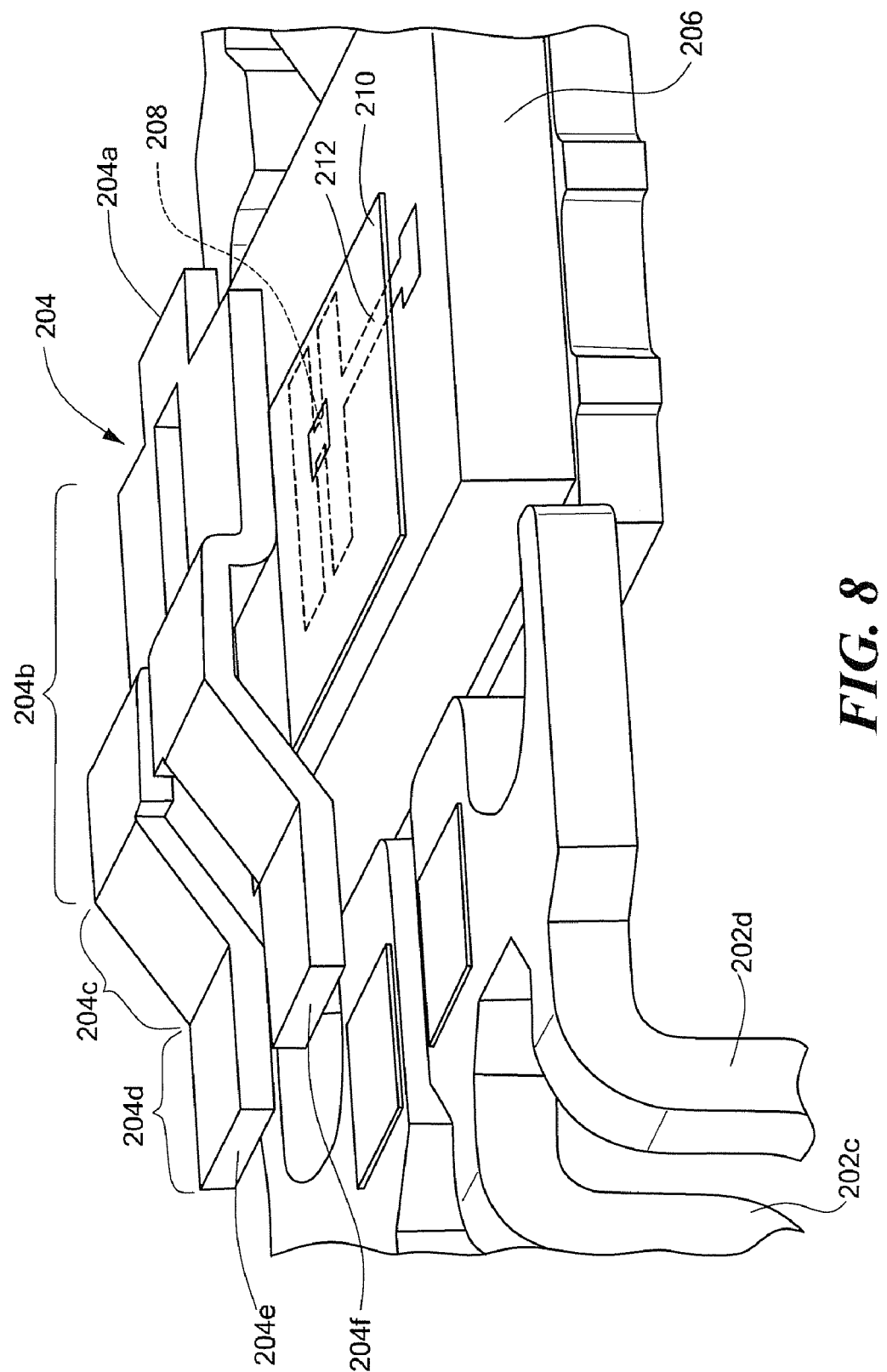
FIG. 8 is a further isometric view of the current sensor of FIG. 7, shown modified to include an insulating layer and an electromagnetic shield according to the invention.

In the embodiment of FIG. 1, the close proximity between the Hall effect element 18 and the current conductor 14 is achieved by providing the Hall effect element 18 on the first substrate surface 16a, which is positioned closer to the current conductor portion 14 than the second surface. In other embodiments, this advantageous close proximity is achieved by providing the Hall effect element 18 on the second substrate surface 16b and forming the current conductor portion 14 so as to be in substantial alignment with the second surface 16b, as shown in FIGS. 7 and 8.

Figure 2:
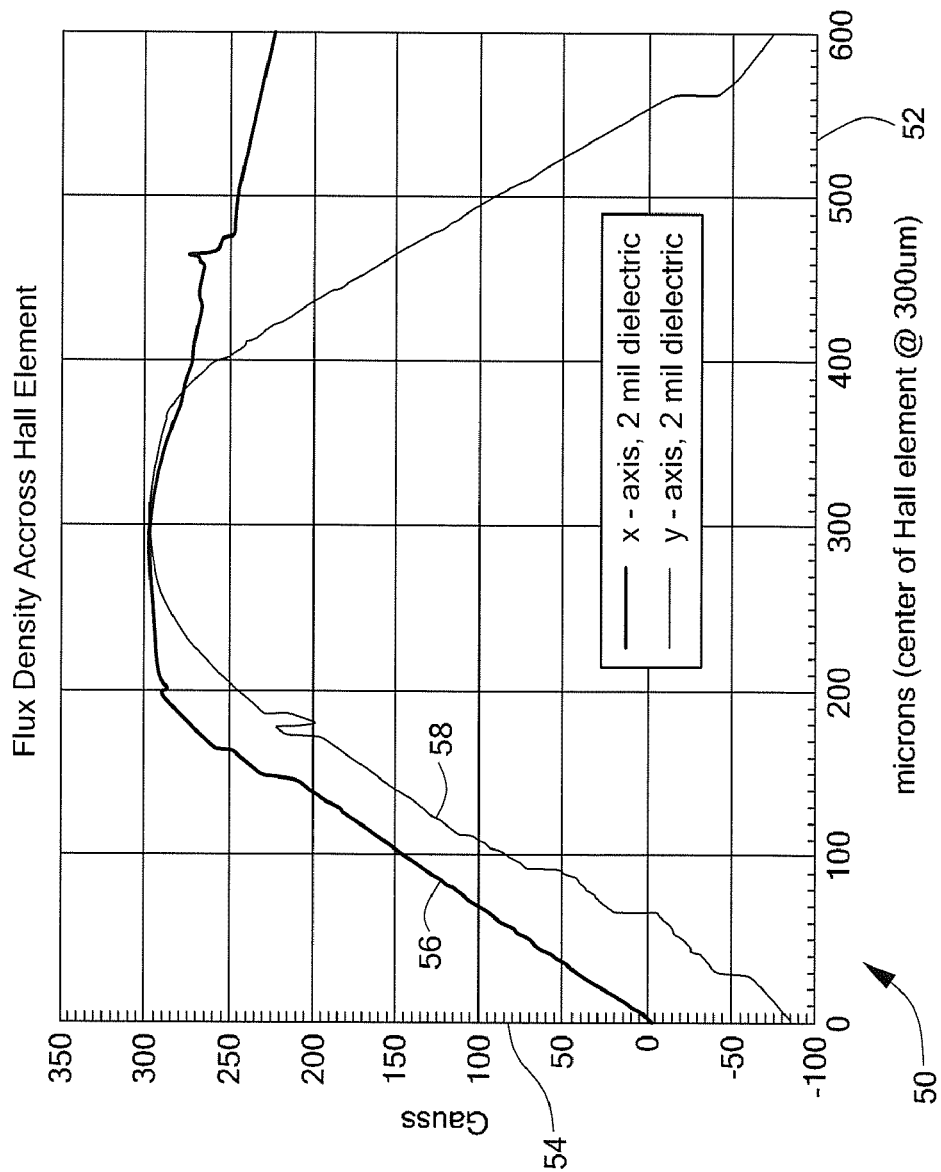
FIG. 2 is a graph showing a relationship between position across a Hall effect element of the current sensor of FIG. 1 and magnetic field.

Referring now to FIG. 2, a graph 50 illustrates the magnetic flux density in the direction of the z-axis 34 (FIG. 1) across the Hall element 18, along an x-axis 30 (FIG. 1) and the y-axis 32 (FIG. 1) in the plane of the Hall effect element 18 (FIG. 1), for a current through current conductor portion 14 on the order of 10A. A center (not shown) of the Hall effect element 18 corresponds to three hundred microns on an abscissa 52. A mantissa 54 corresponds to magnetic flux.

A magnetic flux curve 56 corresponds to the change in magnetic flux in the z-axis 34 relative to position along the x-axis 30. Magnetic flux curve 58 corresponds to the change in magnetic flux in the z-axis 34 relative to position along the y-axis 32.

The magnetic flux curves 56, 58 can be characterized as being substantially flat in the vicinity of the Hall element, which is centered at 300 μm. Therefore, the output of the Hall effect element 18, which is sensitive to magnetic fields in the direction of the z-axis 34, is relatively insensitive to the position of the Hall effect element 18 along the x-axis 30 and along the y-axis 32.

An illustrative Hall effect element 18 has dimensions along the x-axis 30 and along the y-axis 32 on the order of 200 microns and therefore the Hall effect element 18 lies in a region between 200 microns and 400 microns on the abscissa 52. A change of position of the Hall effect element 18 by 50 microns either along the x-axis 30 or along the y-axis 32 results in little change in the magnetic field sensed by the Hall effect element. Therefore, the position of the Hall effect element in the x-axis 30 and the y-axis 32 can vary with manufacturing position tolerances without substantial effect upon the sensitivity of the current sensor 10 (FIG. 1).

The width w1 (FIG. 1) of the current conductor portion 14 in the x-direction 30 relative to the dimension of the Hall effect element 18 in the x-direction 30 significantly affects the uniformity of the flux density in the z-direction 34 with position along the Hall effect element 18 in the x-direction 30. In particular, the longer the current conductor portion 14 (i.e., the greater the width w1, FIG. 1), relative to the width of the Hall effect element 18 in the x-direction 30, the longer the curve 56 remains substantially flat.

The width w1 (FIG. 1 ) is selected in accordance with a variety of factors, including, but not limited to a desired sensitivity of the current sensor 10 (FIG. 1), and a desired reduction of performance variation resulting from manufacturing variation in relative position of the current path 14 and the Hall effect element 18. In general, it will be appreciated that selecting the width w1 to be comparable to a width of the Hall effect element 18, provides the greatest sensitivity of the current sensor 10. However, it will also be appreciated that selecting the width w1 to be greater than the width of the Hall effect element 18 provides the smallest performance variation resulting from manufacturing tolerance of Hall element positional placement in the x-direction 30.

Referring now to FIG. 3, another exemplary current sensor 70 in accordance with the present invention includes a lead frame 72 having a plurality of leads 72a-72h and a current conductor portion 74 having a width w2. The current sensor also includes a substrate 76 having a first surface 76a and a second, opposing surface 76b. The substrate 76 has first and second Hall effect elements 78a, 78b diffused into the first surface 76a, or otherwise disposed on or supported by the first surface 76a. The substrate 76 is disposed on the lead frame 72 so that the Hall effect element 78 is in close proximity to the current conductor portion 74. In the illustrated embodiment, the substrate 76 has an orientation that is upside down (i.e., the first surface 76a is directed downward) in relation to the conventional orientation of a substrate mounted in an integrated circuit package. An insulator (not shown) can separate the substrate 76 from the lead frame 72. The insulator can be the same as or similar to the insulator 24 shown in FIG. 1.

With this arrangement, both of the Hall effect elements 78a, 78b are disposed in close proximity to the current conductor portion 74 and at predetermined positions relative to the current conductor portion 74 such that a magnetic field generated by an electrical current passing though the current conductor portion 74 in a direction shown by arrows 86, is in a direction substantially aligned with a maximum response axis of the Hall effect elements 78a, 78b. Here, the Hall effect elements 78a, 78b each have a maximum response axis aligned with a z-axis 94. Therefore, the Hall effect elements 78a, 78b are disposed on opposite sides (i.e., slightly offset along a y-axis 92) of the current conductor portion 74, as shown, where the magnetic field is pointed along the z-axis 94. In one embodiment, the Hall effect elements 78a, 78b are offset (along the y-axis 92) by substantially equal and opposite amounts about the current conductor portion 74. However, Hall effect elements, or another type of magnetic field sensors, for example magnetoresistance elements, having maximum response axes aligned in another direction, can be disposed at other positions relative to the current conductor portion 74, for example, on top (in a direction of the z-axis 94) of the current conductor portion 74.

In operation, current flows into the leads 72c, 72d, which are coupled in parallel, through the current conductor portion 74, and out of the leads 72a, 72b, which are also coupled in parallel. The current flowing though the current conductor portion 74 generates a magnetic field which is sensed by the Hall effect elements 78a, 78b. As described above, the Hall effect elements 78a, 78b are in very close proximity to the current conductor portion 74 and at a predetermined position relative to the current conductor portion 74 for which the magnetic field generated by the current is substantially aligned with the maximum response axis of the Hall effect elements 78a, 78b. This placement results in a greater voltage output from the Hall effect elements 78a, 78b, and therefore improved sensitivity.

It will be appreciated that the magnetic fields experienced by the first and the second Hall effect elements 78a, 78b are oriented in opposite directions, each aligned along the z-axis 94. Therefore, if polarized in the same direction, the outputs of the two Hall effect elements 78a, 78b will be opposite in polarity. If the output from one of the Hall effect elements 78a, 78b is inverted, for example with an inverting amplifier, and then summed, i.e., differentially summed, with the output of the other of the Hall effect elements 78a, 78b, certain advantages are achieved.

As an initial advantage, the outputs of two Hall effect elements 78a, 78b, when differentially summed as described above, provide a voltage output of twice the magnitude of the voltage output from a single Hall effect element in the presence of the same current. Therefore, the current sensor 70 has twice the sensitivity of the current sensor 10 of FIG. 1.

As a second advantage, the current sensor 70 is relatively insensitive to variation in the position of the Hall effect elements 78a, 78b in the direction of the y-axis 92. This is because, when moved in the direction of the y-axis 92, the voltage output from one of the Hall effect elements 78a, 78b tends to increase while the voltage output from the other of the Hall effect elements 78a, 78b tends to decrease. Therefore, the differential sum of the two outputs remains relatively invariant.

While the lead frame 72 is shown to have the flat leads 72a-72h suitable for surface mounting to a circuit board, it will be appreciated that a lead frame having bent leads, like the lead frame 12 of FIG. 1, can also be used. Also, while two Hall effect elements 78a, 78b are shown, more than two or fewer than two Hall effect elements can also be used.

Referring now to FIG. 4, a summing circuit 100 suitable for performing the differential signal summation described in conjunction with FIG. 3 is shown coupled to two Hall effect elements 102a, 102b. The Hall effect elements 102a, 102b can be the same as or similar to the Hall effect elements 78a, 78b of FIG. 3. Here, each of the Hall effect elements 102a, 102b is rotated relative to the other Hall effect element by 90 degrees, as indicated by vectors on the Hall effect elements 102a, 102b. Therefore, in response to opposite magnetic fields 112a, 112b the Hall effect elements 102a, 102b generate output voltages 103a, 103b having the same polarities. The output voltage 103a is coupled to amplifier 104a arranged in a non-inverting configuration and the output voltage 103b is coupled to the amplifier 104b arranged in an inverting configuration. Therefore, the amplifier output voltages 106a, 106b move in opposite voltage directions in response to the magnetic fields 112a, 112b. The amplifier output voltages 106a, 106b are differentially coupled to an amplifier 108 to generate a differential summation, or a difference of the output voltages 106a, 106b. Therefore, the output voltages 106a, 106b differentially sum to provide a greater output voltage 110 at the output of amplifier 108.

The summing circuit 100 can be used in the current sensor 70 of FIG. 3, in which case Hall effect elements 102a, 102b correspond to the Hall effect elements 78a, 78b. In one particular embodiment, the summing circuit 100 is diffused into, or otherwise disposed upon, the first surface 76a of the substrate 76. In another embodiment, the summing circuit 100 is diffused into, or otherwise disposed upon, the second surface 76b of the substrate 76, while the Hall effect elements 78a, 78b remain on the first surface 76a, coupled to the other circuit components though vias or the like.

Referring now to FIG. 5, in which like elements of FIG. 1 are shown having like reference designations, another exemplary current sensor 120 includes a substrate 126 having a first surface 126a and a second, opposing surface 126b. Here, four Hall effect elements 128a-128d are diffused into or otherwise disposed on the first surface 126a of the substrate 126. The substrate 126 is positioned relative to the lead frame 12 such that first and second Hall effect element 128a, 128b respectively are on one side of the current conductor portion 14 along a y-axis 142, and third and fourth Hall effect elements 128c, 128d are on the opposite side of the current conductor portion 14 along the y-axis 42, as shown. In one embodiment, the Hall effect elements 128a, 128b are offset (along the y-axis 142) from the current conductor portion 14 by an amount equal to and opposite from the amount that the Hall effect elements 128c, 128d are offset (along the y-axis 142) from the current conductor portion 14.

With this arrangement, the Hall effect elements 128a-128d are disposed in close proximity to the current conductor portion 14 and at predetermined positions relative to the conductor portion 14, such that a magnetic field generated by an electrical current passing though the current conductor portion 14 in a direction shown by arrows 86, is in a direction substantially aligned with a maximum response axis of the Hall effect elements 128a-128d. Here, each of the Hall effect elements 128a-128d has a maximum response axis aligned with a z-axis 144. In the illustrated embodiment, the Hall effect elements 128a, 128b are disposed on an opposite side (i.e., slightly offset along a y-axis 142) of the current conductor portion 144 than the Hall effect elements 128c, 128d, as shown, where the magnetic field is pointed along the z-axis 144. However, Hall effect elements, or another type of magnetic field sensors, for example magnetoresistance elements, having maximum response axes aligned in another direction, can be disposed at other positions relative to the current conductor portion 14, for example, on top (in a direction of the z-axis 144) of the current conductor portion 14. It will be appreciated that the first and second Hall effect elements 128a, 128b are exposed to a magnetic field in a direction along the z-axis 144 and the third and forth Hall effect elements 128c, 128d are exposed to a magnetic field in the opposite direction along the z-axis 144.

The four Hall effect elements 128a-128d can be coupled to an electronic circuit arranged as a summing circuit, understood by one of ordinary skill in the art, in order to achieve certain advantages. The summing circuit, for example, can include two of the summing circuits 100 of FIG. 4. In one embodiment, the summing circuit can couple a first two of the Hall effect elements 128a-128d with a first summing circuit, such as the summing circuit 100 of FIG. 4, and a second two of the Hall effect elements 128a-128d with a second summing circuit, such as the summing circuit 100. With another amplifier, an output of the first summing circuit can be summed with an output of the second summing circuit. As an initial advantage, the four Hall effect elements 128a-128d, coupled to a summing circuit as described, in the presence of the current, provide a voltage output four times the magnitude of a voltage output from a single Hall effect element, for example the Hall effect element 18 of FIG. 1, in the presence of the same current. Therefore, the current sensor 120 has four times the sensitivity of the current sensor 10 of FIG. 1.

As a second advantage, the current sensor 120 is relatively insensitive to variation in the position of the Hall effect elements 128a-128d in the direction of the y-axis 142. This is because, when moved in the direction of the y-axis 142, the voltage output from two of the four Hall effect elements 128a-128d tends to increase while the voltage output from the other two of the four Hall effect elements 128a-128d tends to decrease. Therefore, when coupled as a summing circuit, the circuit output is relatively invariant to the y-axis position of the Hall effect elements.

Figure 6:
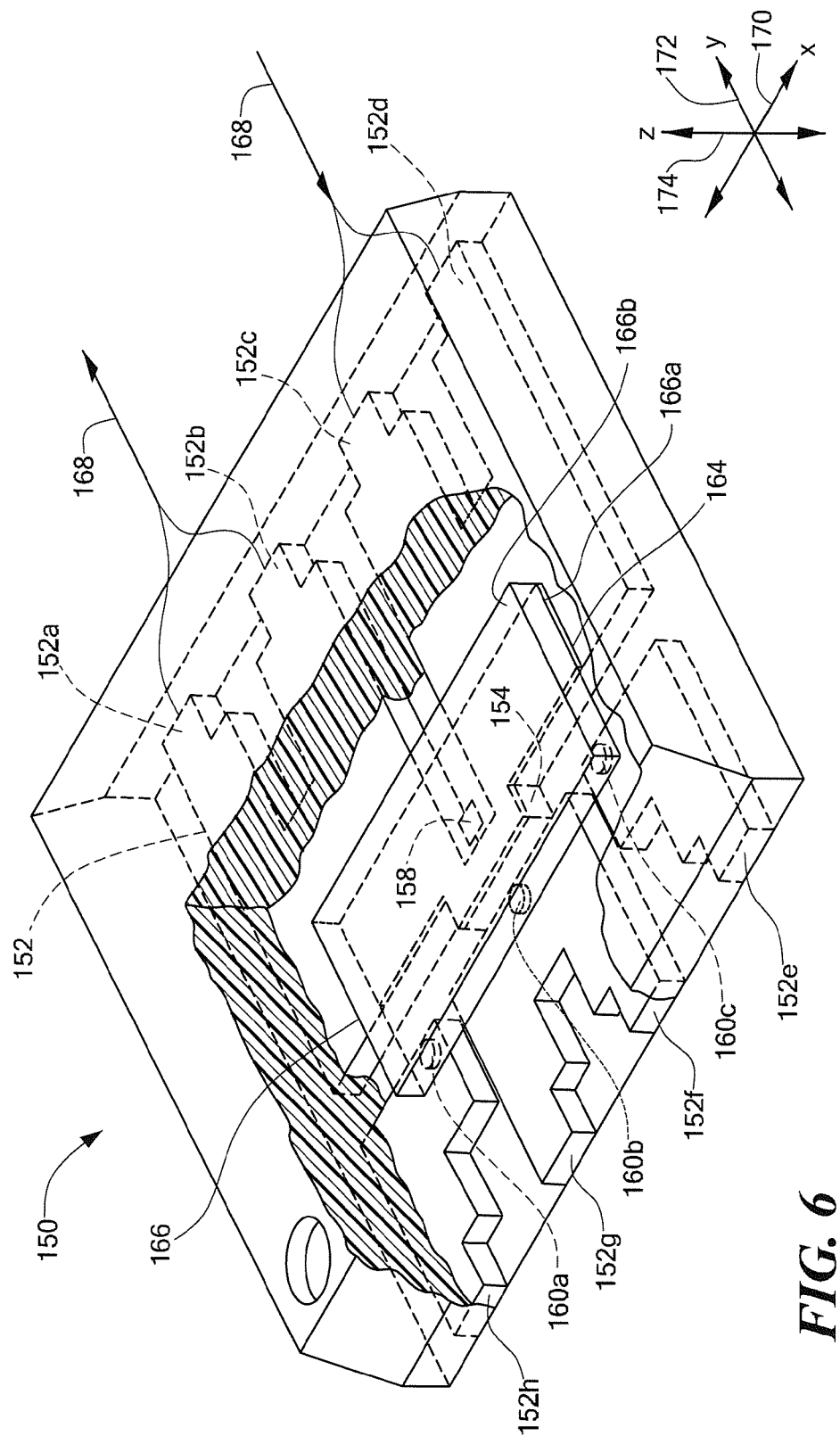
FIG. 6 is an isometric view of still another embodiment of a current sensor in accordance with the present invention.

Referring now to FIG. 6, an exemplary current sensor 150 in accordance with the present invention includes a lead frame 152 having a plurality of leads 152a-152h and a current conductor portion 154. The current sensor 150 also includes a substrate 166 having a first surface 166a and a second, opposing surface 166b. The substrate 166 has a Hall effect element 158 diffused into the first surface 166a, or otherwise disposed on the first surface 166a. The substrate 166 is disposed on the lead frame 152 so that the Hall effect element 158 is in close proximity to the current conductor portion 154. The substrate 166 has an orientation that is upside down (i.e., the first surface 166a is directed downward) in relation to the conventional orientation with which a substrate is mounted into an integrated circuit package. The substrate 166 is a flip-chip having solder balls 160a-160c on the first surface 166a of the substrate 166. The solder balls 160a-160c couple directly to the leads 152e-152h as shown. An insulator 164 separates the substrate 166 from the lead frame 152. The insulator 164 can be the same as or similar to the insulator 24 shown in FIG. 1.

With this arrangement, the Hall effect element 158 is disposed in close proximity to the current conductor portion 154 and at a predetermined position relative to the conductor portion 154, such that a magnetic field generated by an electrical current passing though the current conductor portion 154 in a direction shown by arrows 168, is in a direction substantially aligned with a maximum response axis of the Hall effect element 158. The Hall effect element 158 has a maximum response axis aligned with a z-axis 174. Therefore, the Hall effect element 158 is disposed just to the side (i.e., slight offset along a y-axis 172) of the current conductor portion 14, as shown, where the magnetic field is pointed along the z-axis 174. However, a Hall effect element, or another type of magnetic field sensor, for example a magnetoresistance element, having a maximum response axis aligned in another direction, can be disposed at another position relative to the current conductor portion 154, for example, on top (in a direction of the z-axis 174) of the current conductor portion 154.

Operation of the current sensor 150 is like the above-described operation of the current sensor 10 of FIG. 1. The Hall effect element 158, being is close proximity to the current conductor portion 154, results in a greater output voltage from the Hall effect element 158, and therefore an improved sensitivity.

While only one Hall effect element 158 is shown on the first surface 166a of the substrate 166, it will be appreciated that more than one Hall effect element can be used with this invention. Other circuitry, for example an amplifier, can also be diffused in or otherwise coupled to or supported by the first and/or second surfaces 166a, 166b of the substrate 166.

While three solder balls 160a-160c are shown, any number of solder balls can be provided, including dummy solder balls for stabilizing the substrate 166. Also, while solder balls 160a-160c are shown, other connection methods can also be used, including, but not limited to gold bumps, eutectic or high lead solder bumps, no-lead solder bumps, gold stud bumps, polymeric conductive bumps, anisotropic conductive paste, or conductive film.

Figure 6A:
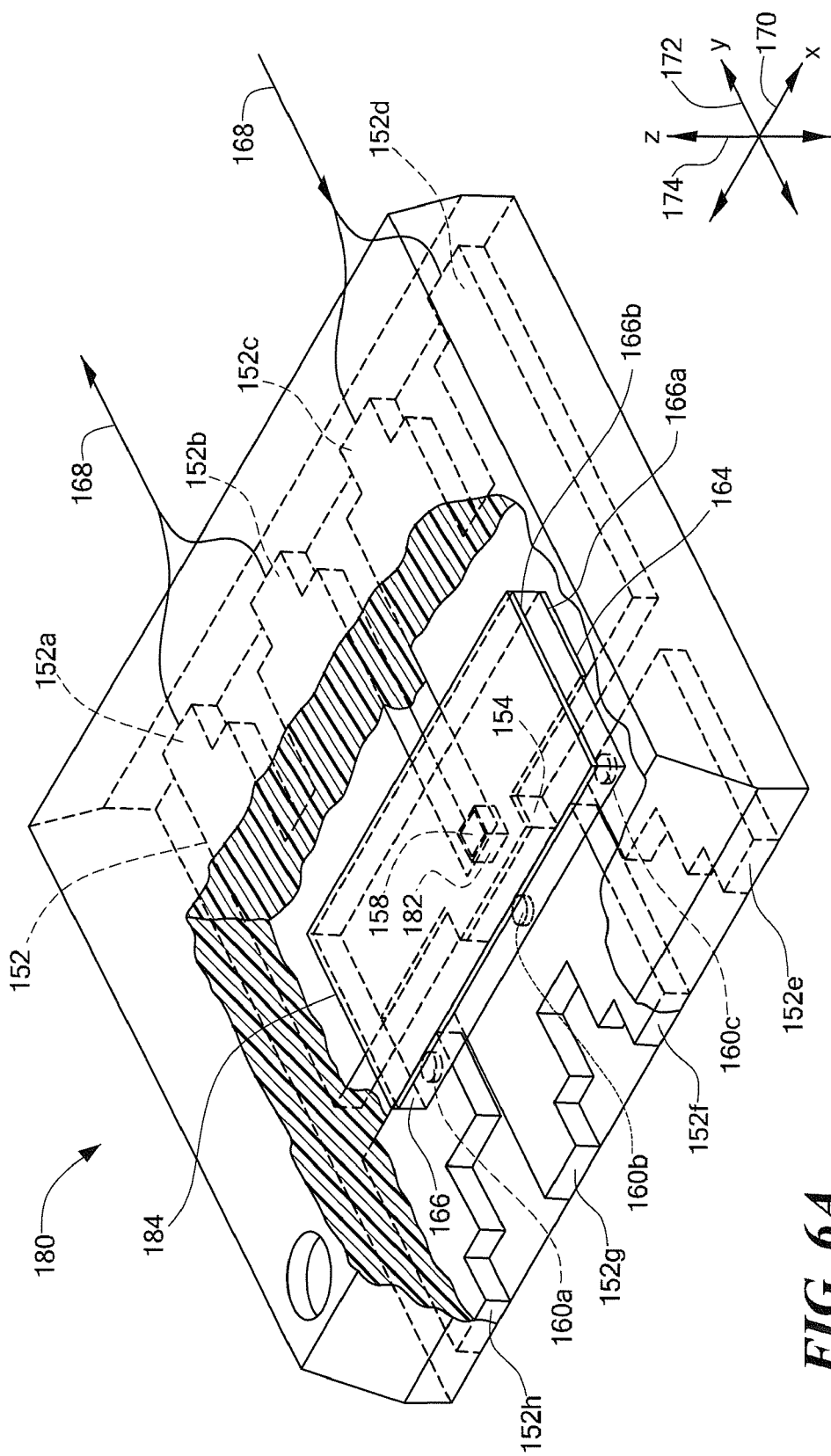
FIG. 6A is an isometric view of still another embodiment of a current sensor in accordance with the present invention.

Referring now to FIG. 6A, in which like elements of FIG. 6 are shown having like reference designations, an exemplary current sensor 180 in accordance with the present invention includes a flux concentrator 182 and a flux concentrating layer 184. The flux concentrator is located proximate the Hall effect sensor 158, adjacent to and below the first surface 166a of the substrate 166. The flux concentrating layer 184 is disposed on (or adjacent to and above) the second surface 166b of the substrate 166.

In operation, the flux concentrator 182 and the flux concentrating layer 184 each tend to concentrate the magnetic flux generated by the current passing through the current conductor portion 154 so as to cause the current sensor 180 to have a higher sensitivity than the current sensor 150 of FIG. 6.

The flux concentrator 182 and the flux concentrating layer 184 can each be comprised of a variety of materials, including but not limited to, ferrite, Permalloy, and iron. An adhesion layer (not shown), for example, a titanium or chromium layer, may be present and would be understood by one skilled in the art.

While the flux concentrator 182 is shown having a cubic shape, in other embodiments, the flux concentrator can have another shape, for example, a polyhedral shape, an elliptical shape, or a spherical shape. While both the flux concentrator 182 and the flux concentrating layer 184 are shown, in other embodiments, only one of the flux concentrator 182 and the flux concentrating layer 184 can be provided. Also, while the flux concentrator 182 and the flux concentrating layer 184 are shown in conjunction with one magnetic field transducer 158, it should be appreciated that the flux concentrator 182 and the flux concentrating layer 184 can also be applied to configurations having more than the one magnetic field transducer 158, for example, the configurations shown in FIGS. 1, 3, and 5.

Referring now to FIG. 7, another exemplary current sensor 200 in accordance with the present invention includes a lead frame 202 having a plurality of leads 202a-202h. The current sensor 200 also includes a substrate 206 having a first surface 206a and a second, opposing surface 206b. The substrate 206 has a Hall effect element 208 diffused into the first surface 206a, or otherwise disposed on the first surface 206a. A conductive clip 204 having a current conductor portion 204a is coupled to the leads 202a-202d. Features of the conductive clip 204 are shown in FIG. 8. Suffice it to say here that the conductive clip is formed having a bend such that the conductive clip 204 passes up and over the first surface 206a of the substrate 206. The substrate 206 is disposed on the lead frame 202 so that the Hall effect element 208 is in close proximity to the current conductor portion 204a. In the illustrated embodiment, the substrate 206 has a conventional mounting orientation with the first surface 206a directed upward. The substrate 206 has bonding pads 212a-212c on the first surface 206a, to which bond wires 210a-210c are coupled. The bond wires 210a-210c are further coupled to the leads 202e, 202f, 202h. An insulator 214 can be provided to isolate the substrate 206 from the conductive clip 204. The insulator 214 can be the same as or similar to the insulator 24 shown in FIG. 1.

With this arrangement, the Hall effect element 208 is disposed in close proximity to the current conductor portion 204a, which passes up and over the first surface 206a of the substrate 206. The Hall effect element 208 is disposed at a predetermined position relative to the conductor portion 204a such that a magnetic field generated by an electrical current passing though the current conductor portion 204a in a direction shown by arrows 216, is in a direction substantially aligned with a maximum response axis of the Hall effect element 208. The Hall effect element 208 has a maximum response axis aligned with a z-axis 224. In the illustrated embodiment, the Hall effect element 208 is disposed just to the side (i.e., slight offset along a y-axis 222) of the current conductor portion 204a, as shown, where the magnetic field is pointed along the z-axis 224. However, a Hall effect element, or another type of magnetic field sensor, for example a magnetoresistance element, having a maximum response axis aligned in another direction, can be disposed at another position relative to the current conductor portion 204a, for example, essentially aligned above or below (in a direction of the z-axis 224) with the current conductor portion 204a.

In operation, current flows into the leads 202c, 202d, which are coupled in parallel, through the conductive clip 204, through the current conductor portion 204a, and out of the leads 202a, 202b, which are also coupled in parallel. The current flowing though the current conductor portion 204a generates a magnetic field, which is sensed by the Hall effect element 208. The Hall effect element 208 generates a voltage output proportional to the magnetic field and therefore proportional to the current flowing though the current conductor portion 204a. As described above, the Hall effect element 208 is in very close proximity to the current conductor portion 204a and at a predetermined position relative to the current conductor portion 204a in which the magnetic field generated by the current is substantially aligned with the maximum response axis of the Hall effect element 208. This position results in a greater voltage output from the Hall effect element 208, and therefore improved sensitivity.

While only one Hall effect element 208 is shown on the second surface 206b of the substrate 206, it will be appreciated that more than one Hall effect element can be used. In particular, an embodiment having two Hall effect elements can be similar to the current sensor 70 of FIG. 3 and an embodiment having four Hall effect elements can be similar to the current sensor 120 of FIG. 5. Also, additional circuitry, for example an amplifier, can be diffused in or otherwise coupled to the first and/or second surfaces 206a, 206b of the substrate 206.

It should be appreciated that the conductive clip 204 can be formed in a variety of ways and from a variety of materials. In one particular embodiment, the conductive clip 204 is stamped, for example, from a copper sheet. In another embodiment, the conductive clip 204 is formed from foil, for example copper foil. In yet another embodiment, the conductive clip 204 is formed by an etching process. The conductive clip 204 allows the use of the conventional mounting orientation of the substrate 206 while bringing the current conductor portion 204a very close to the Hall effect element 208.

The conductive clip 204 can be provided having a thickness selected in accordance with an amount of current that will pass through the conductive clip 204. Therefore, if a current sensor adapted to sense relatively high currents is desired, the conductive clip can be relatively thick, whereas, if a current sensor adapted to sense relatively low currents is desired, the conductive clip 204 can be relatively thin. In another embodiment, if a current sensor adapted to sense relatively high currents is desired, more than one conductive clip 204 can be stacked in contact with other conductive clips to provide an increased effective thickness that is thicker than any one conductive clip 204, and therefore, able to carry more current.

In the embodiment of FIG. 7, the close proximity between the Hall effect element 208 and the current conductor portion 204a is achieved by providing the Hall effect element 208 on the first substrate surface 206a, which is positioned closer to the current conductor portion 204a than the second surface 206b. In other embodiments, this advantageous close proximity is achieved by providing the Hall effect element 208 on the second substrate surface 206b and forming the current conductor portion 204a so as to be in substantial alignment with the second surface 206b.

Referring now to FIG. 8, in which like elements of FIG. 7 are shown having like reference designations, the conductive clip 204 is shown before it is coupled to the leads 202a-202d. The conductive clip 204 includes the current conductor portion 204a, a transition region 204b, a bend region 204c, and a bonding region 204d. The bonding region 204d includes two portions 204e, 204f which couple to the leads 202a-202d. The transition region 204b can be elevated relative to the current conductor portion 204a to avoid contact with the substrate 206.

While Hall effect elements have been shown and described in association with embodiments of this invention, it will be recognized that other types of magnetic field sensors can be used. For example, magnetoresistance elements can be used in place of the Hall effect elements. However, a conventional magnetoresistance element has a maximum response axis that is perpendicular to the maximum response axis of a conventional Hall effect element. One of ordinary skill in the art will understand how to position one or more magnetoresistance elements relative to a current conductor portion in accordance with embodiments of the present invention to achieve the same results as the Hall effect element embodiments herein described.

In some embodiments, an insulating layer 220 can be disposed between the conductive clip 204 and the first surface 206a of the substrate 206. The insulating layer 220 can be formed from a variety of materials, including but not limited to, silicon dioxide and polymer. In some embodiments, an electromagnetic shield 222 can also be disposed between the conductive clip 204 and the first surface 206a of the substrate 206. The electromagnetic shield 222 can be disposed either under or over the insulating layer 220, in proximity to the Hall effect element 208. In other arrangements, shown, for example, in FIG. 23, there can be two insulating layers, one above and one below the electromagnetic shield 222.

The electromagnetic shield 222 tends to reduce the affect of electromagnetic fields upon the Hall effect element 208, which would tend to make the current sensor 200 less accurate, i.e., to be sensitive to electrical effects other than the magnetic field generated by a current. It will be understood that it is desirable to have the Hall effect element 208 be sensitive only to magnetic fields, and not to electromagnetic fields. The electromagnetic shield 222 is described in greater detail below in conjunction with FIGS. 19-22.

While the electromagnetic shield 222 is shown in conjunction with the current sensor 200 of FIGS. 7 and 8, it should be appreciated that any of the current sensors described herein, including flip-chip arrangements and non flip-chip arrangements, can have an electromagnetic shield the same as or similar to the electromagnetic shield 222, disposed in proximity to an associated Hall effect element.

Figure 9:
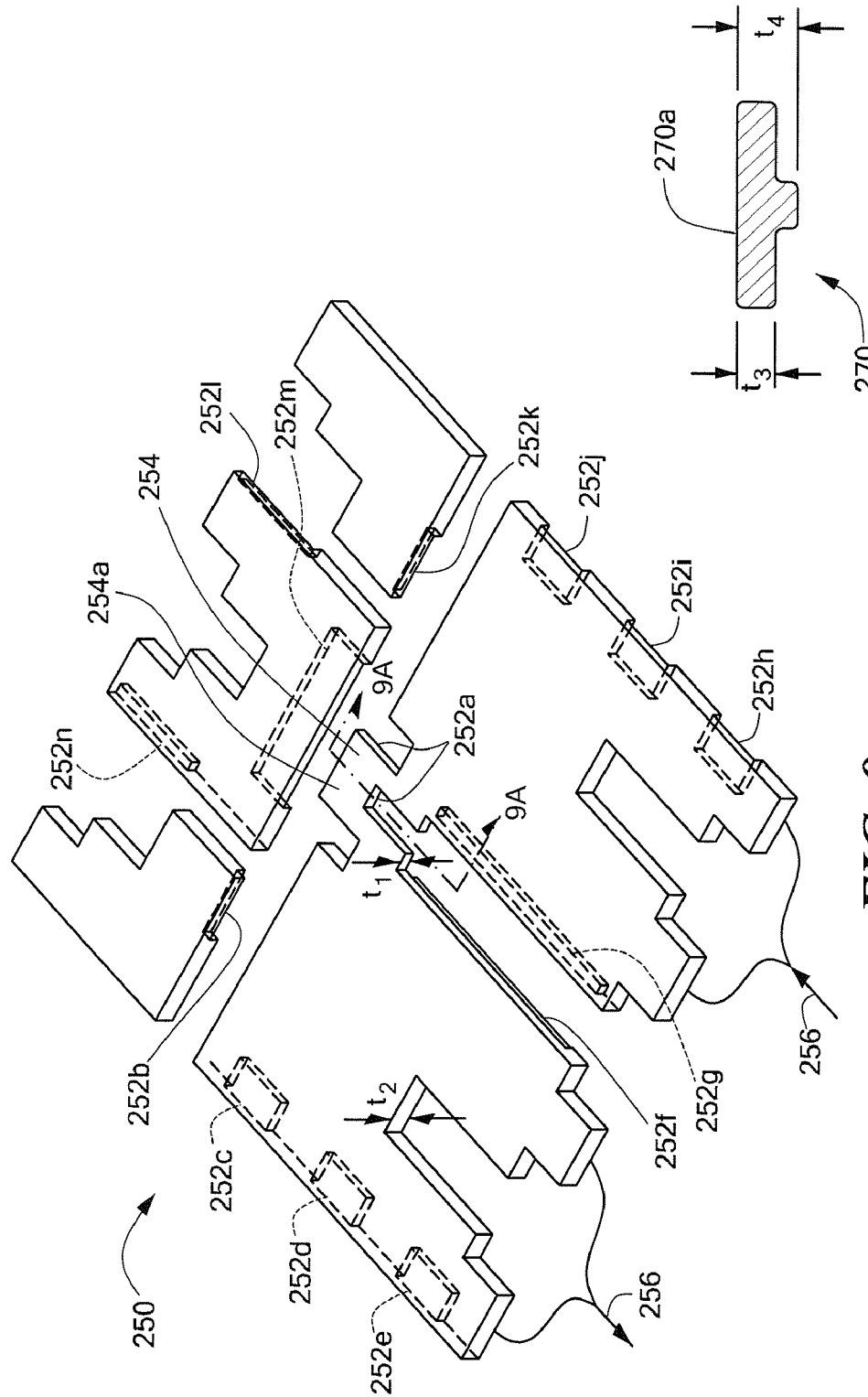
FIG. 9 is an isometric view of an alternate lead frame having a thinner current conductor portion according to a further aspect of the invention.

Referring now to FIG. 9, a lead frame 250 is shown having a shape similar to the lead frame 72 of FIG. 3 and the lead frame 152 of FIG. 6. The lead frame 250 has a plurality of thinned portions 252a-252n that are thinner than other portions of the lead frame 250. The thinner portions can be provided by a variety of processes, including, but not limited to, chemical etching and stamping.

A current conductor portion 254 has a surface 254a and a thickness t1 which can be the same as or similar to the thickness of others of the thinned portion 252b-252n. Other portions of the lead frame have a thickness t2. In one particular embodiment, the thickness t1 of the current carrying portion 254 is the same as the thickness of the other thinned portions 252b-252n, and the thickness t1 is approximately half of the thickness t2. In one embodiment, the current conductor portion 254 has a cross section that is essentially rectangular, having the thickness t1.

It will be recognized that, in the presence of a current passing through the current conductor portion 254, the current conductor portion 254 being thinner, for example, than the current conductor portion 74 of FIG. 3, has a higher current density near the surface 254a than the current conductor portion 74 of FIG. 3 has near the surface 74a in the presence of a similar current. In other words, the current is compressed to be closer to the surface 254a than it would otherwise be with a thicker current conductor portion. As a result, a magnetic field generated by the current has a higher flux density in proximity to the surface 254a.

Therefore, when the lead frame 250 is used in place of the lead frame 72 of FIG. 3, the Hall effect elements 78a, 78b experience a greater magnetic field, resulting in a more sensitive current sensor.

Others of the thinned portion 252b-252n provide other advantages. For example, when the lead frame 250 is molded into a plastic surrounding body, the other thinned portions 252b-252n tend to lock the lead frame 250 more rigidly into the molded body.

The thickness t1 is selected in accordance with a variety of factors, including, but not limited to, a maximum current to be passed through the current conductor portion 254.

It will be understood that thinned portions can be applied to others of the lead frames shown above in embodiments other than the embodiment of FIG. 3 in order to achieve the same advantages.

Referring now to FIG. 9A, an alternate current conductor portion 270, suitable for replacing the current conductor portion 254 of FIG. 9, has a T-shaped cross section as would be seen from a cross-section taken along line 9A-9A of FIG. 9. The T-shape has a surface 270a, a first thickness t3, and a second thickness t4. The thickness t3 can be the same as or similar to the thickness t1 of FIG. 9, and the thickness t4 can be the same as or similar to the thickness t2 of FIG. 9. In one particular embodiment the thickness t3 is approximately half of the thickness t4.

For substantially the same reasons describe above in conjunction with FIG. 9, a magnetic field generated in response to a current passing through the current conductor portion 270 is higher in proximity to the surface 270a than it would be if the current conductor portion 270 had a uniform thickness t4.

While the current conductor portion 254 (FIG. 9) and the current conductor portion 270 have been described to have a rectangular cross section and a T-shaped cross section respectively, it should be appreciated that other cross-sectional shapes can be provided to achieve the above advantages.

Figure 10:
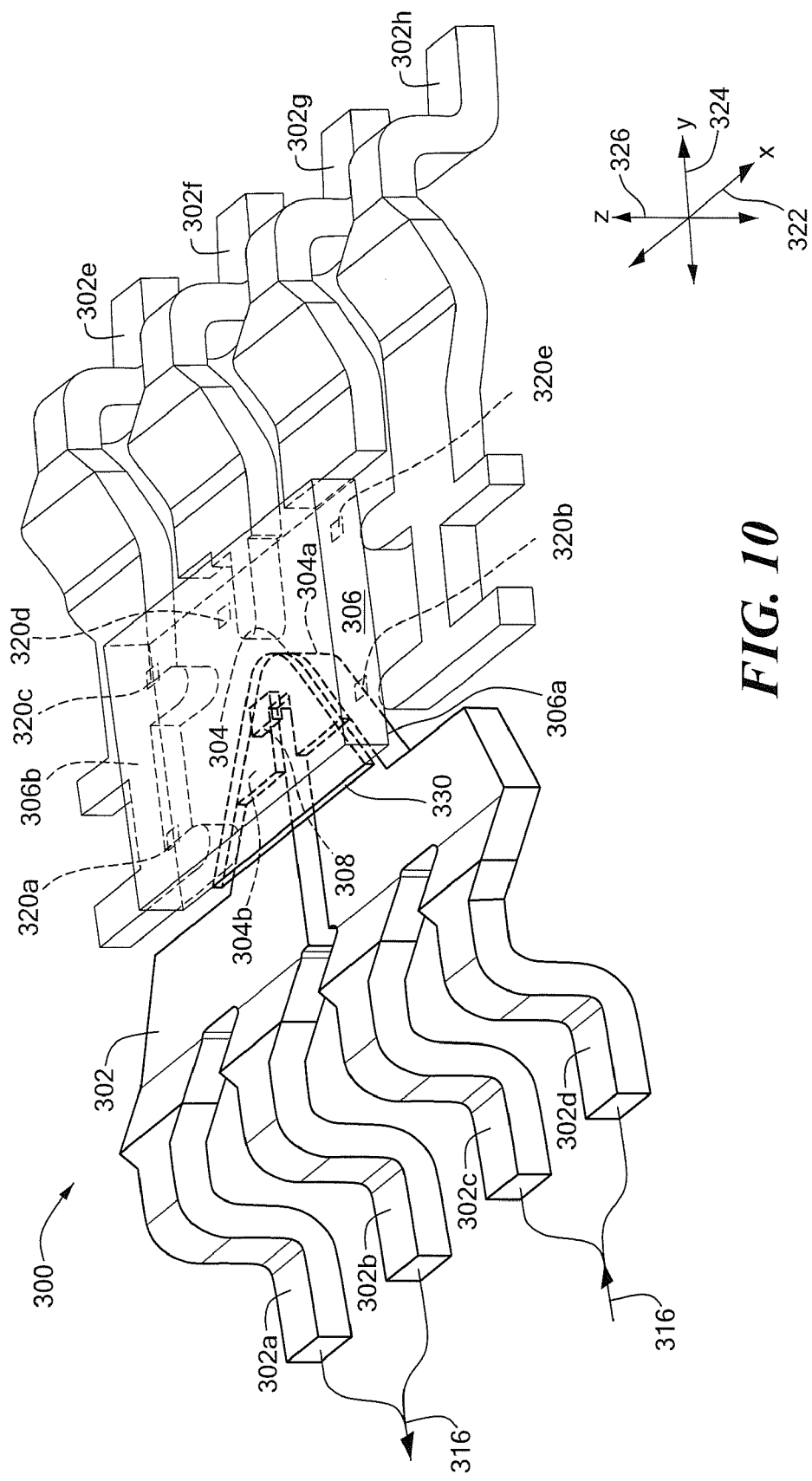
FIG. 10 is an isometric view of still another embodiment of a current sensor in accordance with the present invention.

Referring now to FIG. 10, another exemplary current sensor 300 in accordance with the present invention includes a lead frame 302 (also referred to herein as a lead frame portion) having a plurality of leads 302a-302h and a current conductor portion 304 provided as a combination of a first current conductor portion 304a and a second current conductor portion 304b. The current sensor 300 also includes a substrate 306 having a first surface 306a and a second, opposing, surface 306b. The substrate 306 has a Hall effect element 308 diffused into the first surface 306a, or otherwise disposed on or supported by the first surface 306a. The substrate 306 is disposed on the lead frame 302 so that the Hall effect element 308 is in close proximity to the current conductor portion 304. In the illustrated embodiment, the substrate 306 has an orientation that is upside down (i.e., the first surface 306a is directed downward) in relation to the conventional orientation of a substrate mounted in an integrated circuit package. The substrate 306 is a flip-chip having solder balls 320a-320e on the first surface 306a of the substrate 306. The solder balls 320a-320e couple directly to the leads 302e-302h. An insulating layer 330 can separate the substrate 306 from the lead frame 302. The insulating layer 330 can be the same as or similar to the insulator 24 shown in FIG. 1.

In one particular embodiment, the second current conductor portion 304b is deposited directly on the first surface 306a of the substrate 306 and no insulating layer 330 is used. The second current conductor portion 304b can be deposited by any conventional integrated circuit deposition technique, including, but not limited to, sputtering and electroplating. In other embodiments, the second current conductor portion 304b is a conductive structure separate from but proximate to the first surface 306a of the substrate 306, and the insulating layer 330 is disposed between the second current conductor portion 304b and the first surface 306a of the substrate 306.

It should be recognized that the Hall effect element 308, the insulating layer 330, the second current conductor portion 304b, and the first current conductor portion are under the substrate 306 as shown.

With these arrangements, the Hall effect element 308 is disposed in close proximity to the current conductor portion 304 and at a predetermined position relative to the current conductor portion 304 such that a magnetic field generated by an electrical current 316 passing though the current conductor portion 304 is in a direction substantially aligned with a maximum response axis of the Hall effect element 308. Here, the Hall effect element 308 has a maximum response axis aligned with a z-axis 326. Therefore, the Hall effect element 308 is disposed to a side (i.e., slightly offset along a y-axis 324) of the current conductor portion 304, as shown, where the magnetic field is pointed along the z-axis 326. However, a Hall effect element, or another type of magnetic field sensor, for example, a magnetoresistance element, having a maximum response axis aligned in another direction, can be disposed at another position relative to the current conductor portion 304, for example, on top (in a direction of the z-axis 326) of the current conductor portion 304.

The insulating layer 330 can be an interposing insulating layer or a substrate insulating layer associated with the substrate 306. In some embodiments for which the insulating layer 330 is an interposing insulating layer, the insulating layer 330 is a ceramic interposing insulating layer.

In some embodiments for which the insulating layer 330 is a substrate insulating layer associated with the substrate 306, the insulating layer 330 is a substrate taped insulating layer formed with a taping process. The substrate taped insulating layer can be comprised of a tape applied to the substrate, including but not limited to, a polymer tape, for example a Kapton® tape.

In still other embodiments for which the insulating layer 330 is a substrate insulating layer associated with the substrate 306, the insulating layer 330 is a substrate deposited insulating layer formed with a deposition process. The deposition process used to form the insulating layer 330 can include a variety of processes, including, but not limited to, a screen printing process, a spin depositing process, a sputtering process, a plasma enhanced chemical vapor deposition (PECVD) process, and a low-pressure chemical vapor deposition (LPCVD) process. The screen printing process can result in a substrate insulating layer comprised of a variety materials, including but not limited to, polymer or ceramic materials. The spin depositing process can result in a substrate insulting layer comprised of a variety materials, including but not limited to a polymer, for example, polyimide (e.g., trade name Pyralin®) or bisbenzocyclobutene (BCB) (e.g., trade name Cyclotene®). The sputtering process can result in a substrate insulting layer comprised of a variety materials, including but not limited to, nitride or oxide. The PECVD process can result in a substrate insulting layer comprised of a variety materials, including but not limited to, nitride or oxide. The LPCVD process can result in a substrate insulting layer comprised of a variety materials, including but not limited to, nitride or oxide.

In still other embodiments for which the insulating layer 330 is a substrate insulating layer associated with the substrate 306, the insulating layer 330 is a substrate oxide insulating layer formed with an oxide generation process. The substrate oxide insulating layer can be comprised, for example, of a silicon dioxide.

In operation, the current 316 flows into the leads 302c, 302d, which are coupled in parallel, through the current conductor portion 304, and out of the leads 302a, 302b, which are also coupled in parallel. The current flowing though the current conductor portion 304 generates a magnetic field, which is sensed by the Hall effect element 308. As described above, the Hall effect element 308 is in very close proximity to the current conductor portion 304 and at a predetermined position relative to the current conductor portion 304 at which the magnetic field generated by the current is substantially aligned with the maximum response axis of the Hall effect element 308. This placement results in a greater voltage output from the Hall effect element 308, and therefore greater sensitivity.

With this arrangement, it will be appreciated that the current 316 flowing through the current conductor portion 304 splits between the first and second current conductor portions 304a, 304b, respectively.

While the lead frame 302 is shown to have the bent leads 302a-302h suitable for surface mounting to a circuit board, it will be appreciated that a lead frame having leads with other shapes can also be used, including but not limited to, through hole leads having a straight shape.

While only one Hall effect element 308 is shown on the first surface 306a of the substrate 306, it will be appreciated that more than one Hall effect element can be used with this invention. Other circuitry, for example an amplifier, can also be diffused in or otherwise coupled to or supported by the first and/or second surfaces 306a, 306b of the substrate 306.

While five solder balls 320a-320e are shown, any number of solder balls can be provided, including dummy solder balls for stabilizing the substrate 306. Also, while solder balls 320a-320e are shown, other connection methods can also be used, including, but not limited to gold bumps, eutectic or high lead solder bumps, no-lead solder bumps, gold stud bumps, polymeric conductive bumps, anisotropic conductive paste, conductive film, or wire bonds.

While the substrate is 306 is shown in a flip-chip arrangement, in other embodiments, the substrate 306 can be conventionally mounted such that the first surface 306a is above the second surface 306b when the integrated circuit 300 is mounted to an uppermost surface of a circuit board. With these arrangements, the first and second current conductor portions 304a, 304b, respectively, are each above the first surface 306a of the substrate 306.

Figure 11:
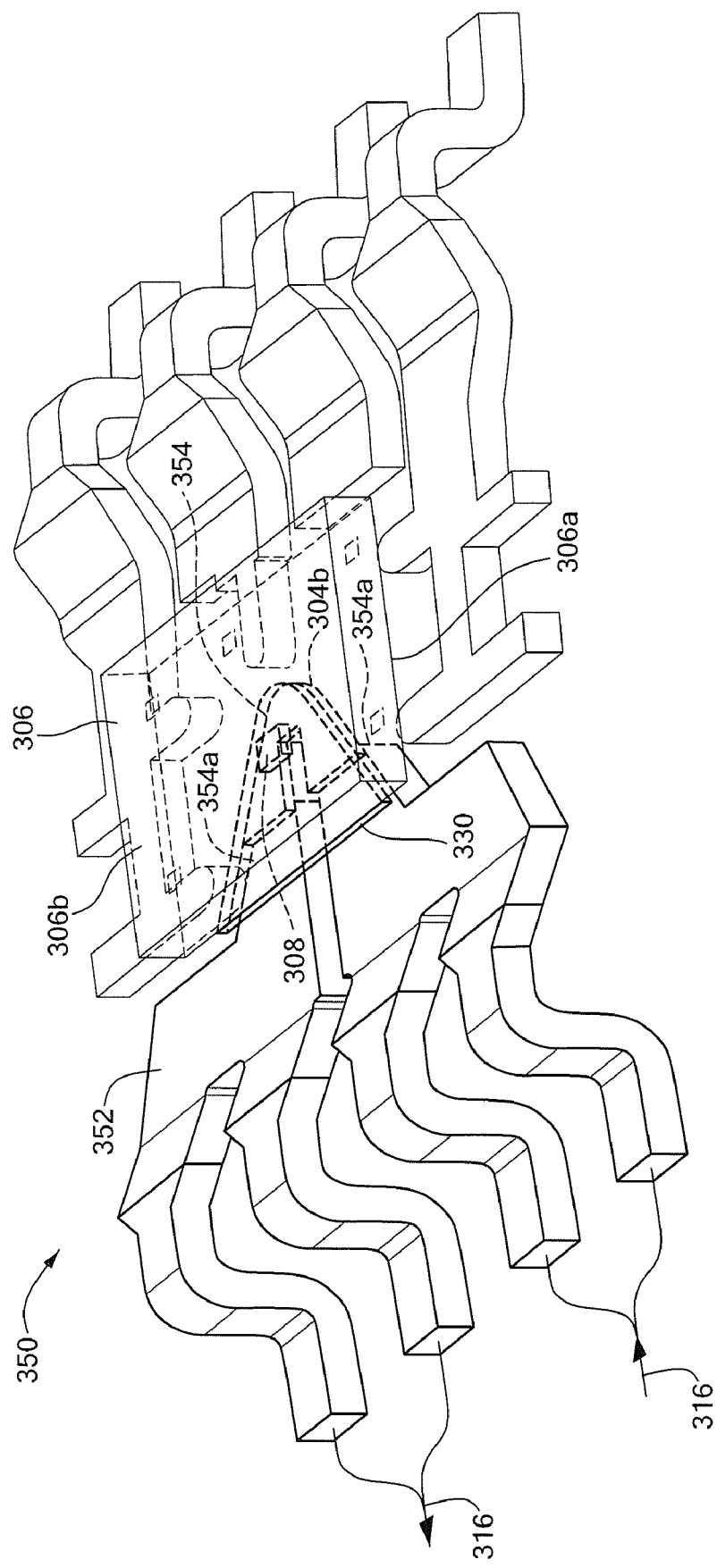
FIG. 11 is an isometric view of an alternate arrangement of the current sensor of FIG. 10.

Referring now to FIG. 11, in which like elements of FIG. 10 are shown having like reference designations, a current sensor 350 differs from the current sensor 300 of FIG. 10 by providing a current conductor portion 354 different than the current conductor portion 304 of FIG. 10. The current conductor portion 354 includes a first current conductor portion 354a and the second current conductor portion 304b. A lead frame 352 having the first current conductor portion 354a does not form a continuous current path, unlike the lead frame 302 having the first current conductor portion 304a of FIG. 10. With this arrangement, it will be appreciated that all of the current 316 flowing through the current conductor portion 354 passes through the second current conductor portions 304b. Therefore, the current 316 passes closer to the Hall effect element 308 than in the current sensor 300 of FIG. 10, resulting in a higher sensitivity.

As described above in conjunction with FIG. 10, while the substrate 306 is shown in a flip-chip arrangement, in other embodiments, the substrate 306 can be conventionally mounted such that the first surface 306a is above the second surface 306b when the integrated circuit 300 is mounted to an uppermost surface of a circuit board. With these arrangements, the first and second current conductor portions 354a, 304b, respectively, are each above the first surface 306a of the substrate 306.

Figure 12:
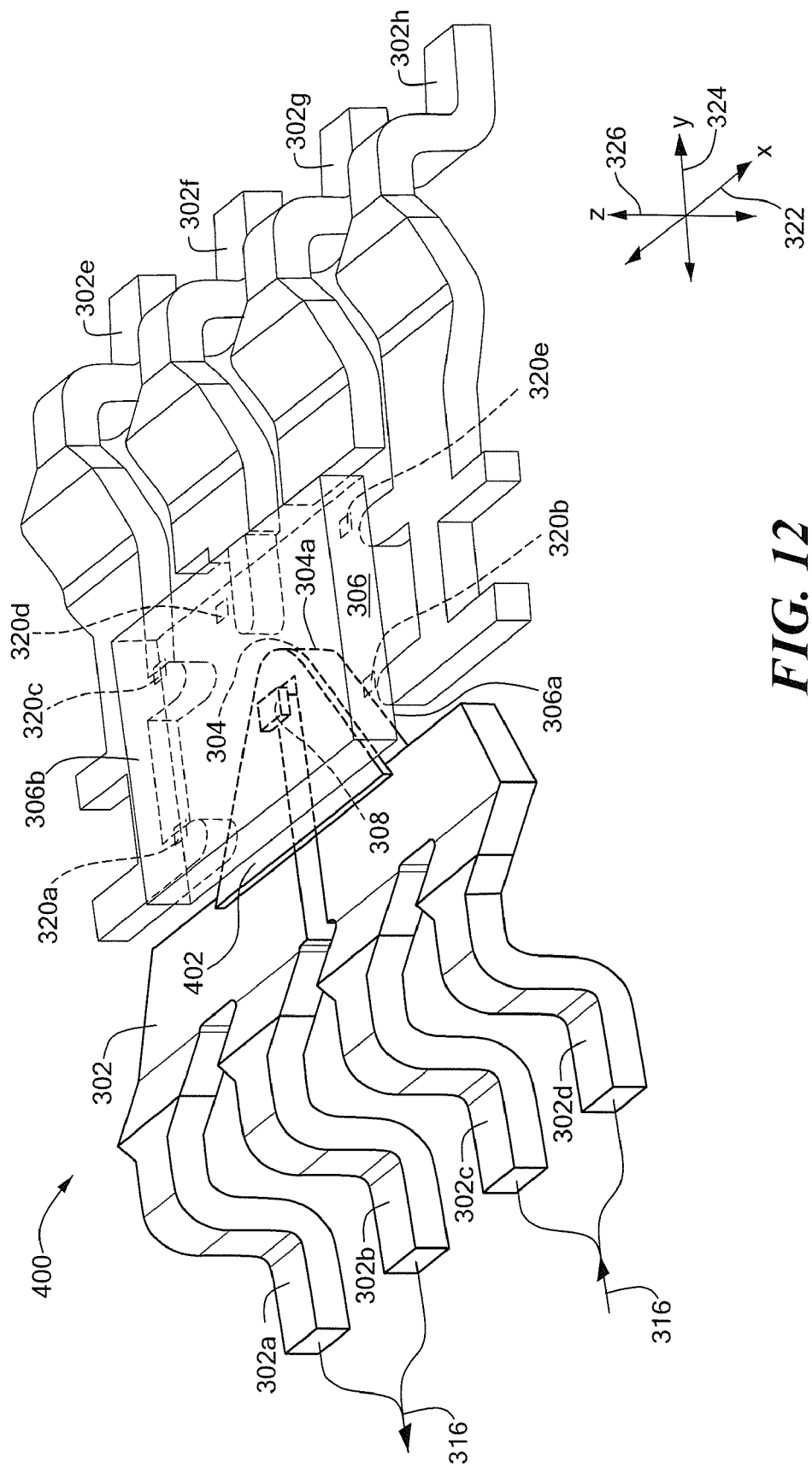
FIG. 12 is an isometric view of another alternate arrangement of the current sensor of FIG. 10.

Referring now to FIG. 12, in which like elements of FIG. 10 are shown having like reference designations, a current sensor 400 differs from the current sensor 300 of FIG. 10 by providing a current conductor portion 304 having only the current conductor portion 304a (i.e., there is no current conductor portion 304b, FIG. 10). The lead frame 302 having the first current conductor portion 304a forms a continuous current path. With this arrangement, it will be appreciated that all of the current 316 passes through the current conductor portion 304a.

An insulating layer 402 is disposed between the current conductor portion 304a and the first surface 306a of the substrate 306. In some embodiments, the insulating layer 402 is an interposing insulating layer, for example a ceramic layer as described above in conjunction with FIG. 10. In other embodiments, the insulating layer 402 is a substrate insulating layer associated with the substrate. In other embodiments, the insulating layer 402 is a lead frame insulating layer associated with the lead frame 302. It will be appreciated that, when associated with the lead frame, the insulating layer 402 can extend beyond the substrate 306 in a direction along the y-axis 324. This arrangement provides enhanced reliability, since an edge of the substrate 306 is less likely to contact the lead frame 302.

Interposing insulating layers and substrate insulating layers are described above, in conjunction with FIG. 10.

In some embodiments for which the insulating layer 402 is a lead frame insulating layer associated with the lead frame 302, the insulating layer 402 is a lead frame taped insulating layer formed with a taping process. The lead frame taped insulating layer can be comprised of a tape applied to the lead frame, including but not limited to, a polymer tape, for example, a Kapton® tape.

In other embodiments for which the insulating layer 402 is a lead frame insulating layer associated with the lead frame 302, the insulating layer 402 is a lead frame sprayed insulating layer formed with a spraying process. The lead frame sprayed insulting layer can be comprised of a variety of materials, including but not limited to a polymer, for example, a polyimide (e.g., trade name Pyralin®), a bisbenzocyclobutene (BCB) (e.g., trade name Cyclotene®) a sprayed dielectric, (e.g., trade names 3M Scotch® Insulating Spray 1601 and Loctite® ShadowCure® 3900), or a spray ceramic coating.

In other embodiments for which the insulating layer 402 is a lead frame insulating layer associated with the lead frame 302, the insulating layer 402 is a lead frame deposited insulating layer formed with a deposition process. The lead frame deposited insulating layer can be formed with a variety of processes, including, but not limited to a screen printing process. The screen printing process can result in a lead frame deposited insulting layer comprised of a variety of materials, including but not limited to, polymers or ceramics. In still other embodiments, the lead frame deposited insulating layer is formed with a vacuum deposition process. For these embodiments, the lead frame deposited insulating layer can be comprised, for example, of a polymer, for example, parylene.

In still other embodiments for which the insulating layer 402 is a lead frame insulating layer associated with the lead frame 302, the insulating layer 402 is a lead frame oxide insulating layer formed with an oxide generation process. The lead frame oxide insulating layer can be comprised, for example, of a sputtered oxide layer disposed onto the lead frame 302.

Figure 13:
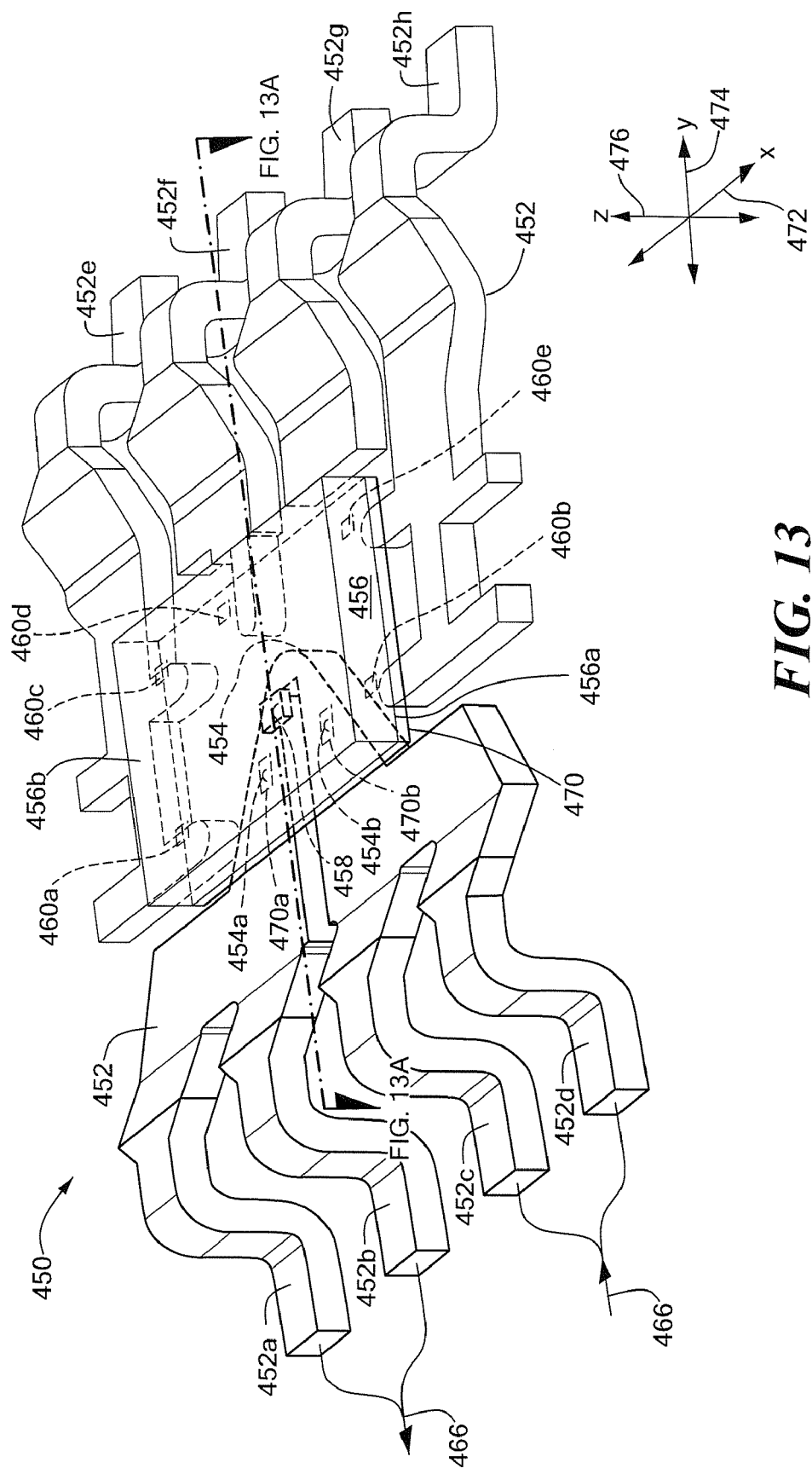
FIG. 13 is an isometric view of another alternate arrangement of the current sensor of FIG. 10.

Referring now to FIG. 13, another exemplary current sensor 450 includes a lead frame 452 (also referred to herein as a lead frame portion) having a plurality of leads 452a-452h and a current conductor portion 454. The lead frame 452 can be similar to the lead frame 302 of FIG. 12. The current sensor 450 also includes a substrate 456 having a first surface 456a and a second, opposing, surface 456b. The substrate 456 has a Hall effect element 458 diffused into the first surface 456a, or otherwise disposed on or supported by the first surface 456a. The substrate 456 is disposed on the lead frame 452 so that the Hall effect element 458 is in close proximity to the current conductor portion 454. In the illustrated embodiment, the substrate 456 has an orientation that is upside down (i.e., the first surface 456a is directed downward) in relation to the conventional orientation of a substrate mounted in an integrated circuit package. The substrate 456 is arranged as a flip-chip having solder balls 460a-460e on the first surface 456a of the substrate 456. The solder balls 460a-460e couple directly to the leads 452e-452h. An insulating layer 470 can separate the substrate 456 from the lead frame 452. The insulating layer 470 can be the same as or similar to the insulator 24 shown in FIG. 1. The insulating layer 470 can cover a substantial portion of the surface 456a. The insulating layer has regions 470a, 470b, which are devoid of insulating material, as will become more apparent from the discussion of FIG. 13A below.

The current conductor portion 454 has two features 454a, 454b (also referred to herein as bumps), which extend upward from the current conductor portion 454 in a direction of a z-axis 476. The bumps 454a, 454b have a size and a shape selected to provide electrical contact between the current conductor portion 454 and the first surface 456a of the substrate 456. In particular, the two bumps 454a, 454b provide electrical contact to metalized features (not shown) upon the first surface 456a of the substrate 456, providing an electrical coupling to circuits (not shown) also disposed on the first surface 456a of the substrate 456. The electrical coupling and the circuits coupled thereto are discussed below in greater detail in conjunction with FIG. 15.

The lead frame 452 having the first current conductor portion 454 forms a continuous current path. With this arrangement, it will be appreciated that most of a current 466 passes through the current conductor portion 454, while some small amount of the current 466 flows into the above-mentioned circuits on the substrate 456 via the bumps 454a and 454b. However, it will be recognized that the above-mentioned circuits can be designed to draw an insignificant amount of the current 466. Therefore, nearly all of the current 466 passes through the current conductor portion 454.

In some embodiments, the insulating layer 470 is an interposing insulating layer, for example a ceramic layer. In other embodiments, the insulating layer 470 is a substrate insulating layer associated with the substrate. In other embodiments, the insulating layer 470 is a lead frame insulating layer associated with the lead frame 452.

Interposing insulating layers, substrate insulating layers, and lead frame insulating layers are described above in conjunction with FIG. 10.

It will become apparent from discussion below in conjunction with FIGS. 13A and 15, that the bumps 454a, 454b can provide a connection, which couples the current conductor portion 454 to circuitry adapted to detect an overcurrent condition, i.e., adapted to detect a current passing through the current conductor portion 452a, which is greater than a predetermined current level or current threshold. To this end, the circuitry can detect a voltage difference between the first bump 454a and the second bump 454b, which is larger than a predetermined voltage drop or voltage threshold.

While only the one current conductor portion 454 is shown, it should be understood that a second current conductor portion can also be used. The second current conductor portion can be the same as or similar to the second current conductor portion 304b of FIG. 10, and can be similarly disposed upon the first surface 456a of the substrate 456 or upon the insulator 470.

Figure 13A:
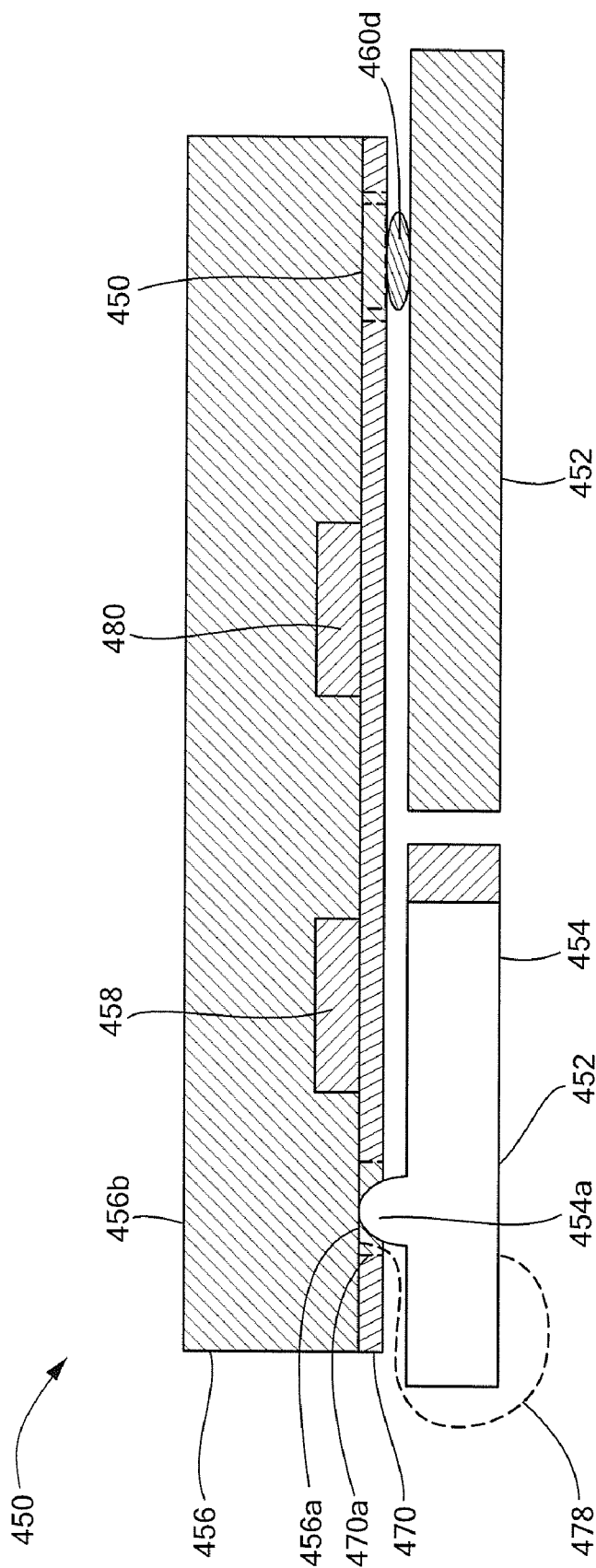
FIG. 13A is a cross-sectional view of the current sensor of FIG. 13.

Referring now to FIG. 13A, in which like elements of FIG. 13 are shown having like reference designations, the current conductor portion 454 includes the bump 454a, which couples the current conductor portion 454 through the region 470a of the insulating layer 470 to the first surface 456a of the substrate 456.

The Hall effect element 458 is disposed in or on the first surface 456a of the substrate 456. Other circuitry 480, electrically coupled to the bump 454a, can also be disposed in or on the first surface 456a of the substrate 456. Exemplary circuitry 480 is described below in conjunction with FIG. 15.

In other embodiments, a wire bond 478 or the like, here shown as a phantom line to indicate that it is an alternative arrangement to the bump 454a, can be used to couple the current conductor portion 454 through the region 470a of the insulating layer 470 to the first surface 456a of the substrate 456. It will be understood that a second wire bond (not shown) can be used in place of the other bump 454b of FIG. 13. While the wire bond 478 appears to terminate to the substrate 456 directly above the current conductor portion 454, it will be appreciated that the termination can be to the side of the current conductor portion 454.

Figure 14:
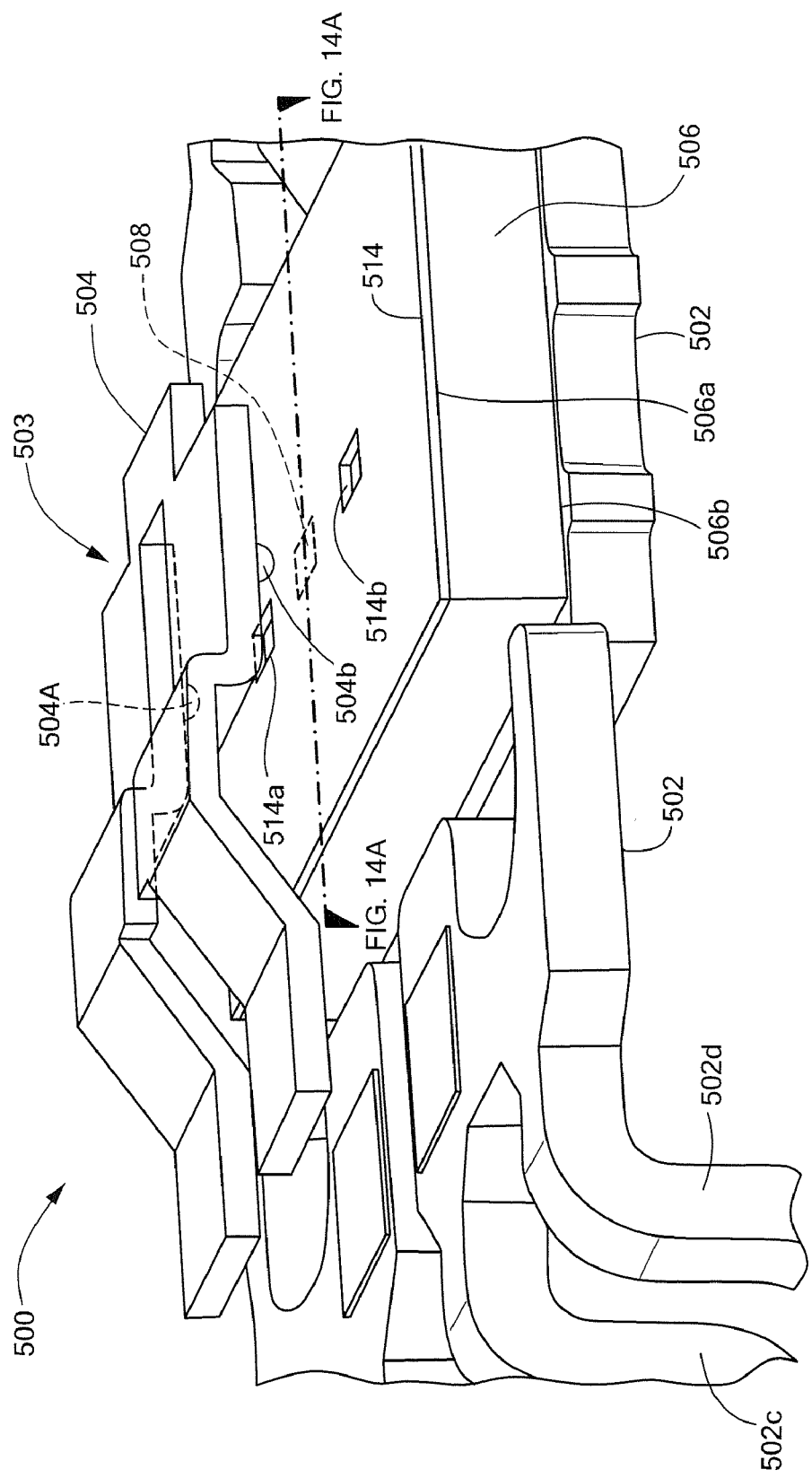
FIG. 14 is an isometric view of an alternate arrangement of the current sensor of FIGS. 7 and 8.

Referring now to FIG. 14, another exemplary current sensor 500 includes a lead frame 502 having a plurality of leads 502a-502h. Only leads 502c and 502d shown for clarity, however, it will be understood that other ones of the leads 502a-502h are arranged in a conventional lead arrangement. The current sensor 500 also includes a substrate 506 having a first surface 506a and a second, opposing, surface 506b. The substrate 506 has a Hall effect element 508 diffused into the first surface 506a, or otherwise disposed on the first surface 506a. A conductive clip 503 having a current conductor portion 504 is coupled to the leads 502a-502d. The current conductor portion 504 includes two bumps 504a, 504b.

The conductive clip 503 is formed having a bend such that the conductive clip 503 passes up and over the first surface 506a of the substrate 506. The substrate 506 is disposed on the lead frame 502 so that the Hall effect element 508 is in close proximity to the current conductor portion 504. In the illustrated embodiment, the substrate 506 has a conventional mounting orientation with the first surface 506a directed upward. An insulator 514 (also referred to herein as an insulating layer) can insulate the substrate 506 from the conductive clip 503. The insulator 514 has two regions 514a, 514b devoid of any insulating material. The insulator 514 can be similar to the insulator 24 shown in FIG. 1.

It will be understood that when the integrated circuit 500 is assembled, the bumps 504a, 504b align with and extend into the regions 514a, 514b of the insulating layer 514, which are devoid of insulating material. The bumps 504a, 504b have a size and a shape selected to provide electrical contact between the current conductor portion 504 and the first surface 506a of the substrate 506. In particular, the two bumps 504a, 504b provide electrical contact to metalized features (not shown) upon the first surface 506a of the substrate 506, providing electrical coupling to circuits (not shown) also disposed on the first surface 506a of the substrate 506. The electrical coupling and the circuits coupled thereto are discussed below in greater detail in conjunction with FIG. 15.

While the conductive clip 503 having the current conductor portion 504, which includes the bumps 540a, 504b is shown, it will be appreciated that, in other arrangements, other current conductor portions, for example, a straight current conductor portion, which includes two features or bumps can also be used.

While only the one current conductor portion 504 is shown, it should be understood that a second current conductor portion can also be used. The second current conductor portion can be the same as or similar to the second current conductor portion 304b of FIG. 10, and can be similarly disposed upon the first surface 506a of the substrate 506 or upon the insulator 514.

Figure 14A:
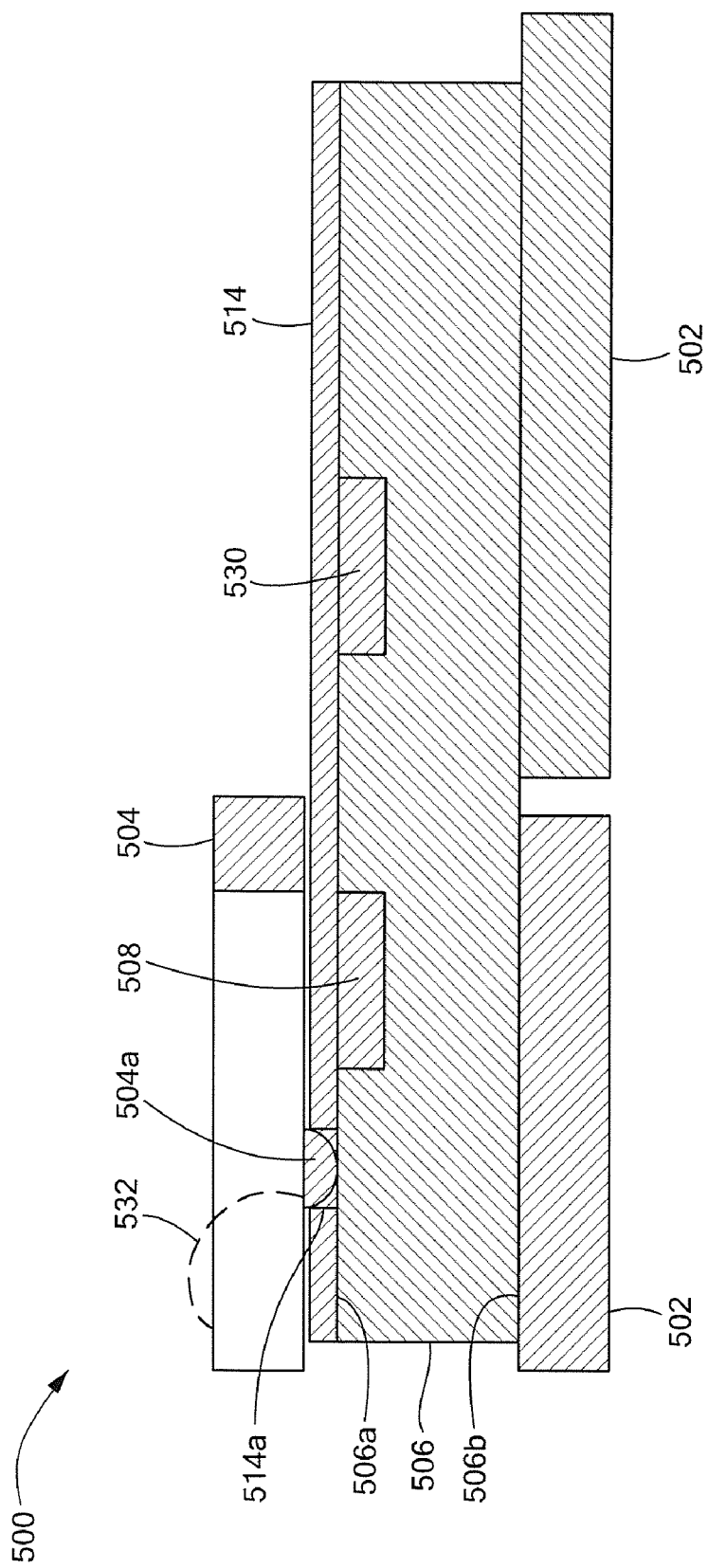
FIG. 14A is a cross-sectional view of the current sensor of FIG. 14.

Referring now to FIG. 14A, in which like elements of FIG. 14 are shown having like reference designations, the current conductor portion 504 includes the bump 504a, which couples the current conductor portion 504 through the region 514a of the insulating layer 514 to the substrate 506.

The Hall effect element 508 is disposed in or on the surface 506a of the substrate 506. Other circuitry 530, electrically coupled to the bump 504a can also be disposed in or on the surface 506a of the substrate 506. Exemplary circuitry 530 is described below in conjunction with FIG. 15.

In other embodiments, a wire bond 532 or the like, here shown as a phantom line to indicate that it is an alternative arrangement to the bump 504a, can be used to couple the current conductor portion 504 through the region 514a of the insulating layer 514 to the first surface 506a of the substrate 506. It will be understood that a second wire bond (not shown) can be used in place of the other bump 504b of FIG. 14. While the wire bond 532 appears to terminate to the substrate 506 under the current conductor portion 506, it will be appreciated that the termination can be to the side of the current conductor portion 506.

Figure 15:
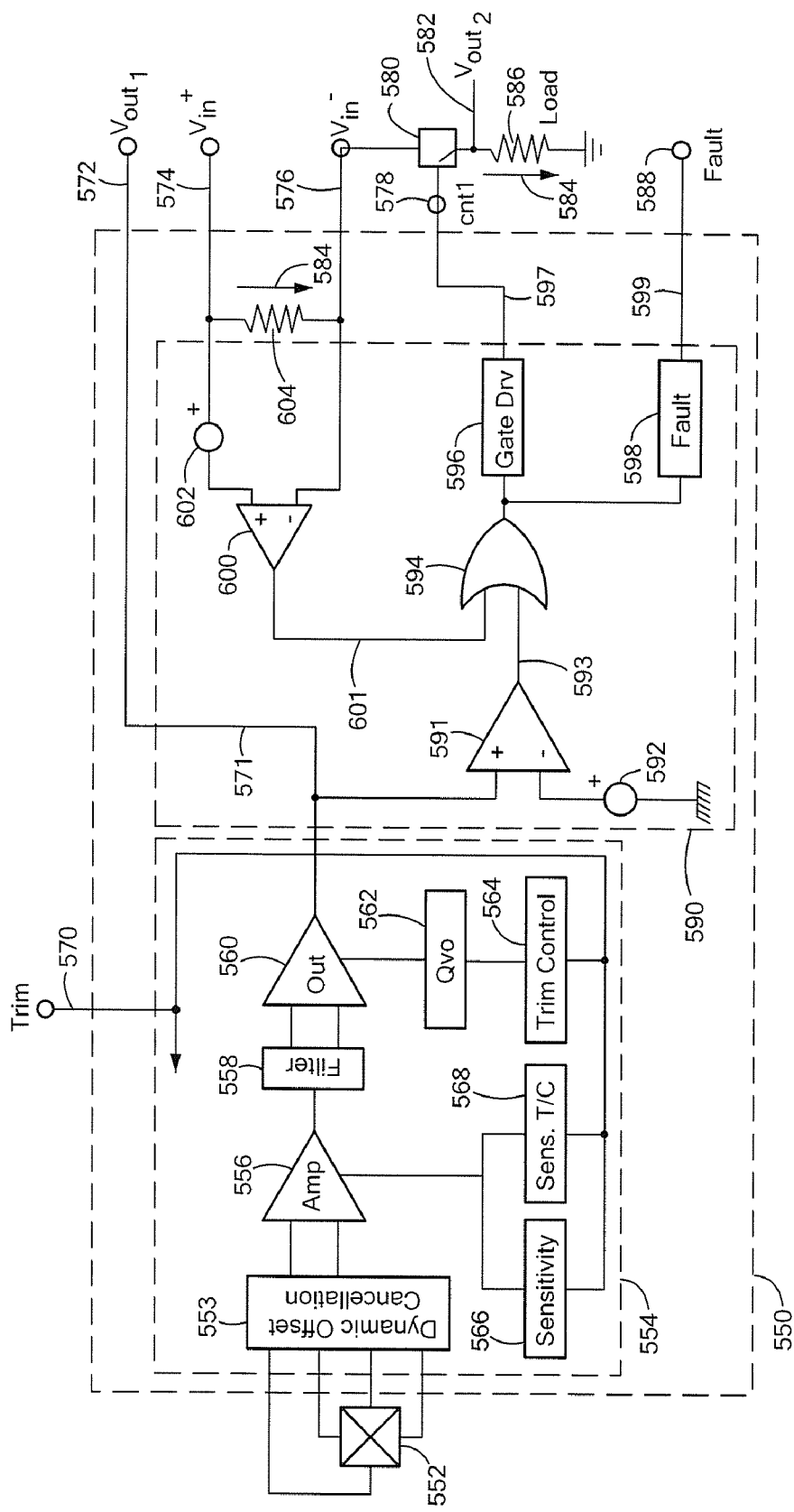
FIG. 15 is a schematic drawing of an exemplary circuit that can be used in the current sensors of FIGS. 13, 13A, 14, and 14A, which includes a current sensing circuit and an overcurrent circuit.

Referring now to FIG. 15, exemplary circuitry 550 can be the same as or similar to the circuitry 480 used in the current sensor 450 of FIG. 13A or the circuitry 530 used in the current sensor 500 of FIG. 14A. The circuitry 550 can be coupled to a Hall effect element 552. The Hall effect element 552 can be the same as or similar to the Hall effect element 458 of FIGS. 13 and 13A, or the Hall effect element 508 of FIGS. 14 and 14A.

The Hall effect element 552 is coupled to a current sensing circuit 554, which includes a dynamic offset cancellation circuit 553. The dynamic offset cancellation circuit 553 provides a DC offset adjustment for DC voltage errors associated with the Hall effect element 552.

The dynamic offset cancellation circuit 553 is coupled to an amplifier 556 that amplifies the offset adjusted Hall output signal. The amplifier 556 is coupled to a filter 558 that can be a low pass filter, a high pass filter, a band pass filter, and/or a notch filter. The filter 558 is selected in accordance with a variety of factors including, but not limited to, a desired response time, and a frequency spectrum of noise associated with the Hall effect element 552, the dynamic offset cancellation circuit 553, and the amplifier 556. In one particular embodiment, the filter 558 is a low pass filter. The filter 558 is coupled to an output driver 560 that provides a current sensor output signal 571 at a node 572 for transmission to other electronics (not shown). As described more fully below, the current sensor output signal is indicative of a magnitude of a current passing though a conductor.

A trim control circuit 564 is coupled to node 570. The node 570 can receive a trim signal that permits various current sensor parameters to be trimmed, typically during manufacture. To this end, the trim control circuit 564 includes one or more counters enabled by an appropriate signal applied to the node 570.

The trim control circuit 564 is coupled to a quiescent output voltage (Qvo) circuit 562. The quiescent output voltage is the voltage of the output signal 571 when the current sensed by the Hall effect element 552 is zero. Nominally, for a unipolar supply voltage, Qvo is equal to Vcc/2. Qvo can be trimmed by applying a suitable trim signal through the node 570 to a first trim control circuit counter within the trim control circuit 564, which, in turn, controls a digital-to-analog converter (DAC) within the Qvo circuit 562.

The trim control circuit 564 is further coupled to a sensitivity adjustment circuit 566. The sensitivity adjustment circuit 566 permits adjustment of the gain of the amplifier 556 in order to adjust the sensitivity of the current sensor 550. The sensitivity can be trimmed by applying a suitable trim signal through the node 570 to a second trim control circuit counter within the trim control circuit 564, which, in turn, controls a DAC within the sensitivity adjustment circuit 566.

The trim control circuit 564 is further coupled to a sensitivity temperature compensation circuit 568. The sensitivity temperature compensation circuit 568 permits adjustment of the gain of the amplifier 556 in order to compensate for gain variations due to temperature. The sensitivity temperature compensation circuit 568 can be trimmed by applying a suitable trim signal through the node 570 to a third trim control circuit counter within the trim control circuit 564, which, in turn, controls a DAC within the sensitivity temperature compensation circuit 568.

The Hall effect element 552 is placed in proximity to a current conductor portion 604, here shown to be apart from the Hall effect element 552 for clarity. The current conductor portion 604 can be the same as or similar to the current conductor portion 454 of FIGS. 13 and 13A and the current conductor portion 504 of FIGS. 14 and 14A, formed by a coupling of integrated circuit leads. In operation, a current 584 enters a node 574 of the current sensor 550, passes through the current conductor portion 604 and out a node 576, where it passes though a switch 580 and through a load 586, both of which can be external to the integrated circuit 550. The switch 580 can be, for example, a relay or a field effect transistor (FET).

It would be desirable to stop the current 584 upon detection of an overcurrent condition, for example a short circuit, which would otherwise result in an undesirably high current 584, which could damage the integrated circuit 550 or other associated circuitry. To this end, an overcurrent circuit 590 can detect the overcurrent condition.

The overcurrent circuit 590 includes a comparator 591 coupled to receive the current sensor output signal 571 and also coupled to a voltage reference 592. An output 593 of the comparator 591 is coupled to a logic gate 594. The logic gate 594 is coupled to a gate driver, which generates a control signal 597 at a node 578 of the circuitry 550. The node 578 is coupled to a control node of the switch 580 and is operable to open the switch 580, stopping the current 584, in response to detection of the overcurrent condition by the Hall effect element 552.

The logic gate 594 is also coupled to a fault circuit 598, which generates a fault output signal 599 at a node 588 of the integrated circuit 550. The fault output signal 599 is indicative of the overcurrent condition, i.e., the current 584 being above a predetermined current.

It will be recognized that the amplifier 591 and the voltage reference 592 are responsive to the current sensor output signal 571, which is responsive to signals generated by the Hall effect element 552. It will be appreciated that the Hall effect element 552 has a relatively slow response time. Therefore, if the switch 580 were controlled only in the fashion described above in response to signals generated by the Hall effect element 552, some rapid overcurrent conditions might damage the integrated circuit 550 or the load 586 before the switch 580 could be opened. Circuitry described below can provide a faster response time to the overcurrent condition.

A comparator 600 and a voltage reference 602 are coupled to the current conductor portion 604 of the integrated circuit 550. As described above, the current conductor portion 604 can be the same as or similar to the current conductor portion 454 of FIGS. 13 and 13A and the current conductor portion 504 of FIGS. 14 and 14A, formed by a coupling of integrated circuit leads. The coupling from the current conductor portion 604 to the voltage reference 602 and to the comparator 600 can be provided in a variety of ways, including but not limited to, the bumps 454a and 454b of FIGS. 13 and 13A and the bumps 504a, 504b of FIGS. 14 and 14A.

In operation, since the current conductor portion 604 has an associated resistance, a voltage appears across the current conductor portion 604 in response to the current 584. When the current 584 is sufficiently large, an output signal 601 of the comparator 600 changes state, causing the control signal 597 to change state, opening the switch 580 and stopping the current. Opening the switch 580 in this manner occurs more rapidly than if the switch 580 were to be opened only by the comparator 591 in response to signals generated by the Hall effect element 592.

It will be appreciated by those of ordinary skill in the art that the circuitry 550 shown in FIG. 15 is illustrative of exemplary circuitry that may be associated with and integrated into a current sensor, like the current sensor 450 of FIGS. 13 and 13A and the current sensor 500 of FIGS. 14 and 14A.

It will also be appreciated that, in other embodiments, the switch 580 can be integrated into the current sensor circuitry 550.

Figure 16:
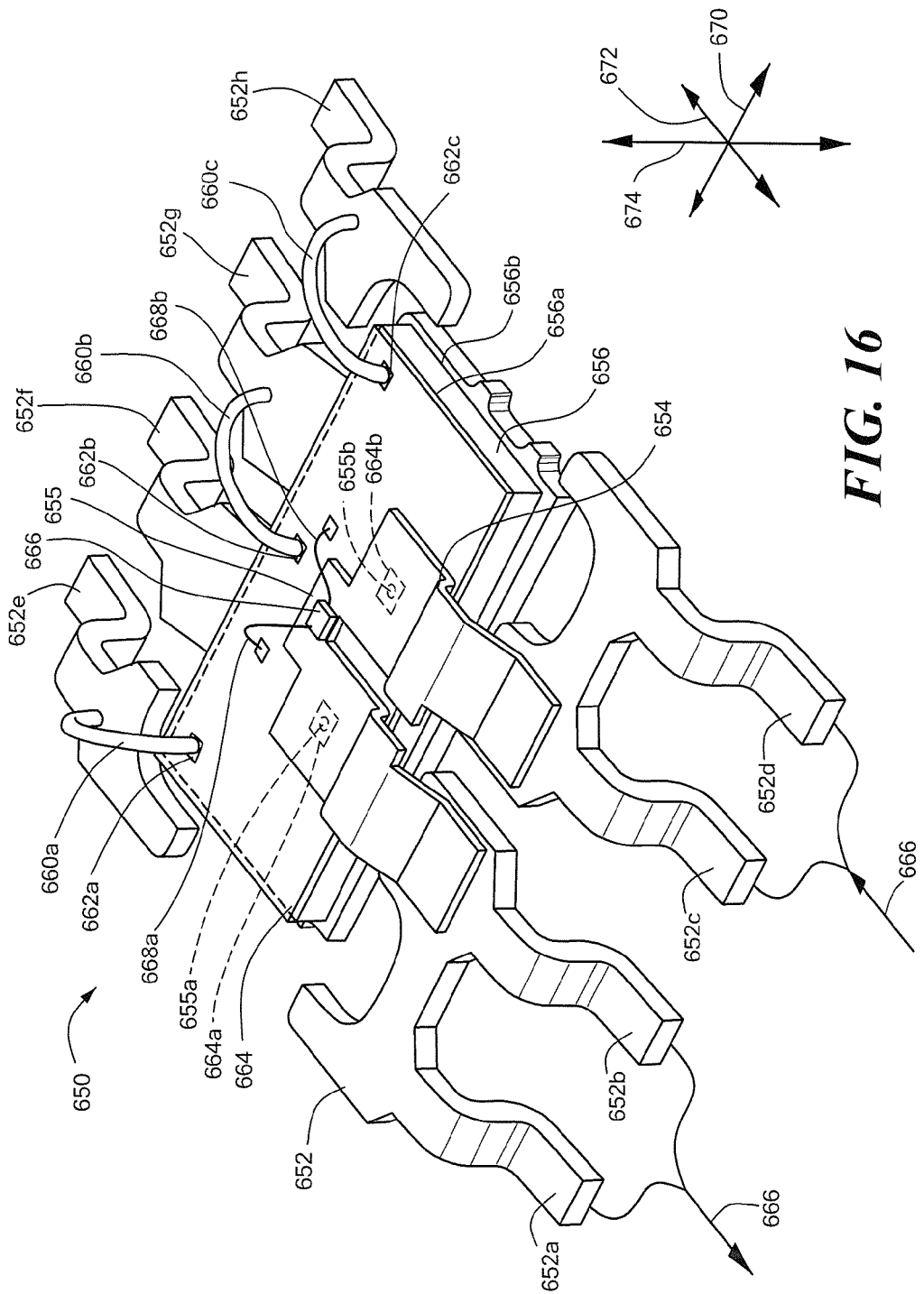
FIG. 16 is an exploded isometric view of another alternate arrangement of the current sensor of FIGS. 7 and 8.

Referring now to FIG. 16, another exemplary current sensor 650 is like the current sensor of 500 of FIG. 14, however, the current sensor 650 includes a second substrate 655 described more fully below. The current sensor 650 includes a lead frame 652 having a plurality of leads 552a-552h. The current sensor 650 also includes a substrate 656 having a first surface 656a and a second, opposing, surface 656b. A conductive clip 654 having a current conductor portion 655 is coupled to the leads 652a-652d. The current conductor portion 605 includes two bumps 655a, 655b. A second substrate 666, having a magnetic field sensing element disposed thereon, for example, a magnetoresistance element (not shown), can be disposed upon the current conductor portion 655. The magnetic field sensing element on the second substrate 666 can be coupled to the first surface 656a of the substrate 656 with wire bonds 668a, 668b or the like.

The conductive clip 654 is formed having a bend such that the conductive clip 654 passes up and over the first surface 656a of the substrate 656. In the illustrated embodiment, the substrate 656 has a conventional mounting orientation with the first surface 656a directed upward. An insulator 664 (also referred to herein as an insulating layer) can insulate the substrate 656 from the conductive clip 654. The insulator 664 has two regions 664a, 664b devoid of any insulating material. The insulator 664 can be similar to the insulator 24 shown in FIG. 1.

Shown in assembled form, the bumps 655a, 655b align with and extend into the regions 664a, 664b of the insulating layer 664, which are devoid of insulating material. The bumps 655a, 655b have a size and a shape selected to provide electrical contact between the current conductor portion 655 and the first surface 656a of the substrate 656. In particular, the two bumps 655a, 655b provide electrical contact to metalized features (not shown) upon the first surface 656a of the substrate 656, providing electrical coupling to circuits (not shown) also disposed on the first surface 656a of the substrate 656. The electrical coupling and the circuits coupled thereto are discussed above in greater detail in conjunction with FIG. 15.

While the conductive clip 654 having the current conductor portion 655, which includes the bumps 655a, 655b is shown, it will be appreciated that, in other arrangements, other current conductor portions, for example, a straight current conductor portion, which includes two features or bumps can also be used.

While only the one current conductor portion 655 is shown, it should be understood that a second current conductor portion can also be used. The second current conductor portion can be the same as or similar to the second current conductor portion 304b of FIG. 10, and can be similarly disposed upon the first surface 656a of the substrate 656 or upon the insulator 664.

The current sensor 650 has two substrate 656, 666. The current sensor 650 shows but one arrangement that can provide two substrates, while also providing a current carrying conductor, e.g., 655, in close proximity to a magnetic field sensing element, and/or while including an overcurrent circuit as described above in conjunction with FIG. 15. Other two substrate arrangements are described in U.S. patent application Ser. No. 11/335,944, entitled "Arrangements for an Integrated Sensor," having inventors Michael C. Doogue, Vijay Mangtani, and William P. Taylor, filed on Jan. 20, 2006, which application is incorporated by reference herein in its entirety. Any of the arrangements described therein can be combined with a current carry conductor and/or with an overcurrent circuit.

The current sensor 450 of FIGS. 13 and 13A, the current sensor 500 of FIGS. 14 and 14A, the current sensor 550 of FIG. 15, and the current sensor 650 of FIG. 16, and are shown having couplings between current conductor portions 454, 504, 604, and 655, respectively, and associated overcurrent circuitry, which is represented by the circuitry 590 of FIG. 15. However, in other embodiments, other current sensors similar to the current sensors 450, 500, 550, and 650 have no couplings between the current conductor portions 454, 504, 604, and 655 and associated overcurrent circuitry, i.e., no bumps or wire bonds. In other words, referring to the current sensor 550 of FIG. 15, the current conductor portion 604 of FIG. 15 does not couple to the nodes 574 or 576 of FIG. 15. In these embodiments, the overcurrent circuitry 590 (FIG. 15), remains coupled to the nodes 574 and 576, and the nodes 574 and 576 couple to another circuit element apart from the current sensor 550. For example, in some arrangements, the nodes 574, 576 can couple to a circuit trace on a circuit board which carries the same current as that which passes through the current conductor portion 604 (FIG. 15). With these arrangements, the overcurrent circuit 590 is able to sense a voltage drop resulting from current passing though the circuit trace, providing essentially the same effect, wherein the overcurrent circuit 590 provides similar functions to those described above.

Figure 17:
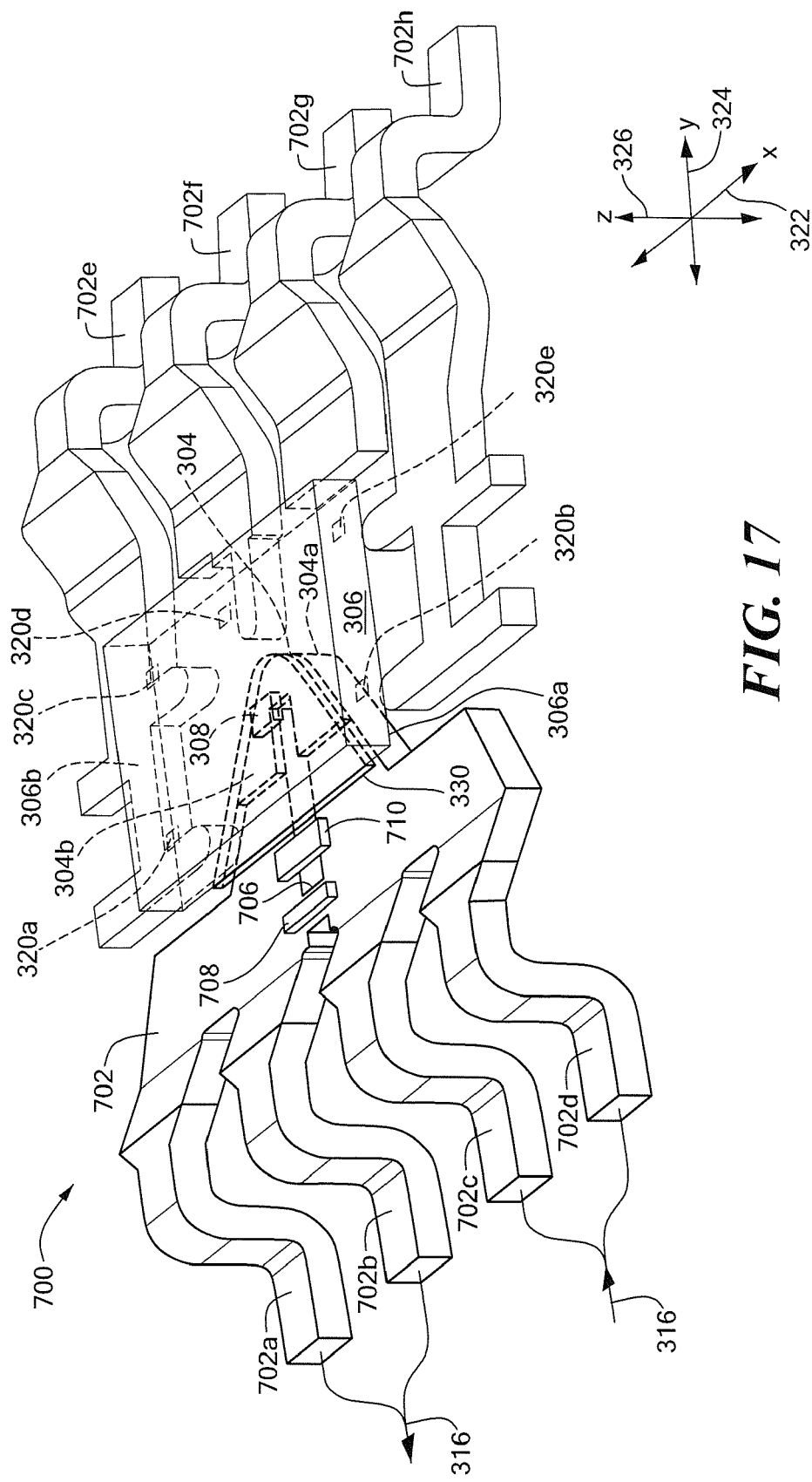
FIG. 17 is an isometric view of another alternate arrangement of the current sensor of FIG. 10.

Referring now to FIG. 17, in which like elements of FIG. 10 are shown having like reference designations, a current sensor 700 includes a lead frame 702 (also referred to herein as a lead frame portion) having a plurality of leads 702a-702h and a shunt conductor portion 706. The current sensor 700, like the current sensor 300 of FIG. 10, also includes the current conductor portion 304 provided as a combination of the first current conductor portion 304a and the second current conductor portion 304b. Thus, the lead frame 702 has two couplings of the leads 702a, 702b to the leads 702c, 702d. A first coupling is provided by the current conductor portion 304 and a second coupling is provided by the shunt conductor portion 706.

In some embodiments, the current sensor 700 can also include a first flux concentrator 708 disposed upon the shunt conductor portion 706 and/or a second flux concentrator 710, which may also be referred to as a magnetic shield (also as a flux shield or shield portion), disposed generally between the shunt conductor portion 706 and the Hall effect element 308. The first and second flux concentrators 708, 710 can each be comprised of a variety of soft-magnetic materials, including but not limited to, ferrite, Permalloy, or nickel-iron alloys. The flux concentrators 708, 710 can be applied in a variety of ways. For example, the flux concentrators can be deposited upon the lead frame 706 with a deposition process.

The flux concentrator 708 can be formed through an electroplating process directly on the lead frame 702, or through the use of a Kapton tape applied to the shunt conductor portion 706, wherein the other side of the Kapton tape can have a soft magnetic material which may be formed through a lamination or tape process. The shield portion 710 can be placed into the lead frame and fixed with an adhesive during package assembly.

In operation, the current conductor portion 304 provides a current path for a portion of the current 316, and the shunt conductor portion 706 provides another current path for another portion of the current 316. It will be understood that the current sensor 700 has a sensitivity to the current 316 related to the portion of the current 316 that flows through the current conductor portion 304. As a result, the current sensor 700 can have a lower sensitivity to the current 316 than the current sensor 300 of FIG. 10, which does not have the shunt conductor portion 706. Therefore, the current sensor 700 can operate over a greater range of currents without saturating circuitry coupled to the Hall effect element 308 (e.g., the circuit 554 of FIG. 15). The greater range of currents is due not only to the affect upon the Hall effect element 308 provided by the shunt conductor portion 706, but also, the lead frame 702, having the shunt conductor portion 706, is able to sustain a greater amount of current without overheating since it can have a lower total resistance current path than the lead frame 302 of FIG. 10.

While the above-described portions of current 316 flowing through the current conductor portion 304 and through the shunt conductor portion 706 tend to provide the above-described results, it will also be recognized that the portion of the current 316 flowing through the shunt conductor portion 706 generates a magnetic field in the vicinity of the Hall effect element 308 that tends to oppose a magnetic field generated by the portion of the current 316 flowing through the current conductor portion 304. In some embodiments, the opposing magnetic field may be undesirable. The first and second flux concentrators 708, 710, respectively, tend to concentrate or shield the magnetic field generated by the portion of the current 316 flowing through the shunt conductor portion 706, therefore, the first and second flux concentrators 708, 710, respectively, tend to keep that magnetic flux away from the Hall effect element 308.

A separation distance between the shunt conductor portion 706 and the Hall effect element 308 can be selected to control and/or to minimize the affect upon the Hall effect element 308 from the magnetic field generated by the portion of the current 316 flowing through the shunt conductor portion 706. It will be understood that a larger separation distance tends to reduce the affect.

Sizing of the shunt conductor portion 706 in a way that affects a resistance of the shunt conductor portion 706 can influence the portion of the current 316 flowing through the shunt conductor portion 706 relative to the portion of the current 316 flowing through the current conductor portion 304. A size and a shape of the shunt conductor portion 706 can be selected accordingly to provide a selected resistance. Therefore, the sizing can affect the overall sensitivity of the current sensor 700

Figure 18:
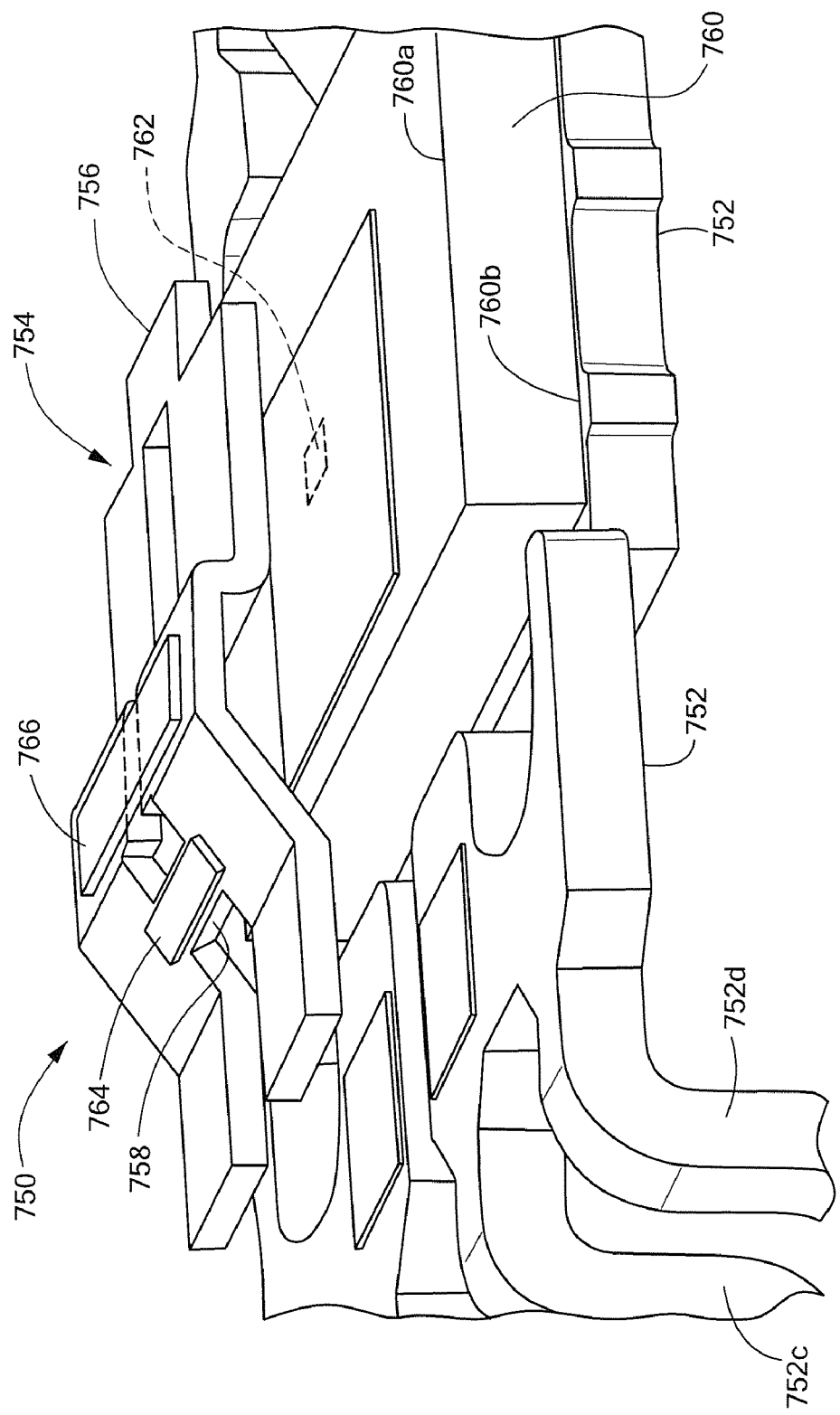
FIG. 18 is an exploded isometric view of another alternate arrangement of the current sensor of FIGS. 7 and 8.

Referring now to FIG. 18, which has elements similar to elements shown in FIG. 8, a current sensor 750 includes a conductive clip 754 having a current conductor portion 756 coupled to leads 752a-752d (752a, 752b not shown, but arranged in the same manner as leads 202a, 202b of FIG. 7, respectively) of a lead frame 752. The conductive clip 754 also includes a shunt conductor portion 758 having similar features and operational characteristics to those described above in conjunction with the shunt conductor portion 706 of FIG. 17. The integrated circuit 750 can also include one or more of a first or a second flux concentrator 764, 766, respectively, having similar features and operational characteristics to the first and second flux concentrators 758, 760, respectively, described above in conjunction with FIG. 17.

Similar to the arrangement described in conjunction with FIGS. 7 and 8, the conductive clip 754 has a shape selected to pass up and over a first surface 760a of a substrate 760. A magnetic field sensing element 762, for example, a Hall effect element, is disposed in or on the first surface 760a of the substrate 760.

While the shunt conductor portions 706, 758 and flux concentrators 708, 710, 764, 766 of FIGS. 17 and 18 are shown in association with particular current sensor arrangements, it will be understood that a similar shunt conductor portion and similar associated flux concentrators can be included in any of the flip-chip or non flip-chip arrangements shown herein.

Figure 19:
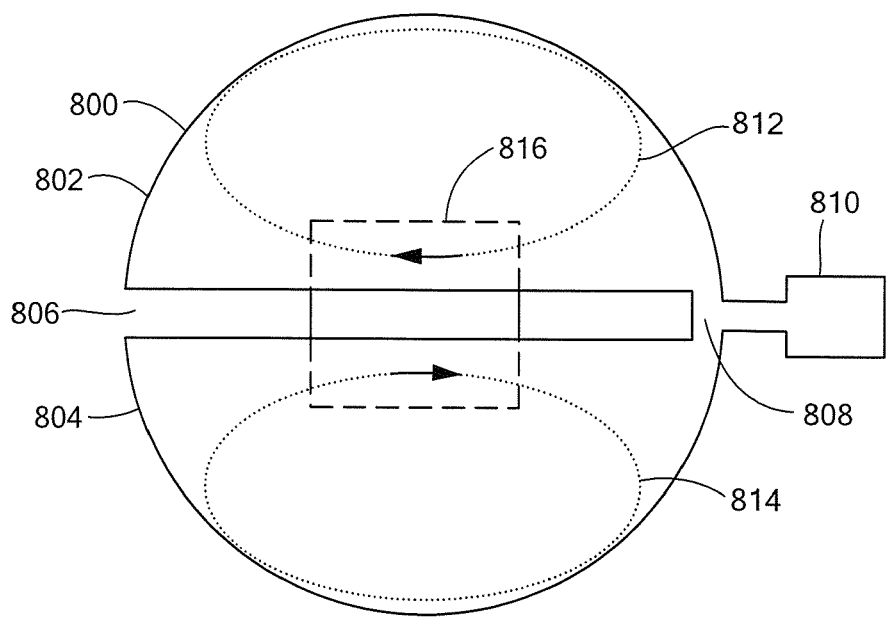
FIG. 19 is a top view of an electromagnetic shield that can form part of a current sensor.

Referring now to FIG. 19, an electromagnetic shield 800 can be the same as or similar to the electromagnetic shield 212 of FIG. 8. The electromagnetic shield 800 is placed generally over a Hall effect element 880, which can be the same as or similar to the Hall effect element 208 of FIG. 8. The electromagnetic shield 800 includes a first portion 802 and a second portion 804 separated by a slit 806. The first portion 802 and the second portion 804 are coupled with a conductive region 808. A bonding pad 810 allows the electromagnetic shield 800 to be coupled to a DC voltage, for example, a ground voltage.

The electromagnetic shield 800 can be formed from a metal layer during manufacture of a current sensor, for example, the current sensor 200 of FIG. 8. The metal layer can be comprised of a variety of materials, for example, aluminum, copper, gold, titanium, tungsten, chromium, or nickel.

In the presence of an AC magnetic field (e.g., a magnetic field surrounding a current carrying conductor), it will be understood that AC eddy currents 812, 814 can be induced in the electromagnetic shield 800. The eddy currents 812, 814 form into closed loops as shown. The closed loop eddy currents 812, 814 tend to result in a smaller magnetic field in proximity to the electromagnetic shield 800 than the magnetic field that induced the eddy current 812, 814. Therefore, if the electromagnetic shield 800 were placed near a Hall effect element, for example, the Hall effect element 208 of FIG. 8, the Hall effect element 208 experiences a smaller magnetic field than it would otherwise experience, resulting in a less sensitive current sensor, which is generally undesirable. Furthermore, if the magnetic field associated with the eddy current is not uniform or symmetrical about the Hall effect element 208, the Hall effect element 208 might also generate an undesirable offset voltage.

The slit 806 tends to reduce a size (i.e., a diameter or path length) of the closed loops in which the eddy currents 812, 814 travel. It will be understood that the reduced size of the closed loops in which the eddy currents 812, 814 travel results in smaller eddy currents 812, 814 and a smaller local affect on the AC magnetic field that induced the eddy current. Therefore, the sensitivity of a current sensor on which the Hall effect element 816 and the electromagnetic shield 800 are used is less affected by the smaller eddy currents.

Furthermore, by placing the shield 800 in relation to the Hall effect element 816 as shown, so that the slit 806 passes over the Hall effect element 816, it will be understood that the magnetic field associated with any one of the eddy currents 812, 814 tends to form magnetic fields passing through the Hall effect element 816 in two directions, canceling over at least a portion of the area of the Hall effect element 816.

Figure 20:
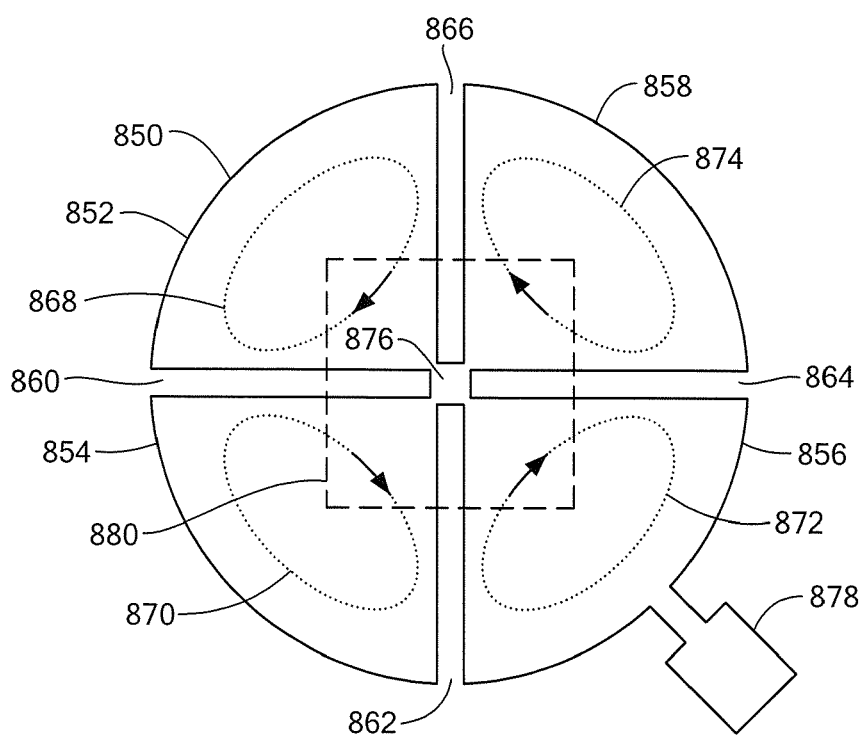
FIG. 20 is a top view of another electromagnetic shield that can form part of a current sensor.

Referring now to FIG. 20, an electromagnetic shield 850 can be the same as or similar to the electromagnetic shield 212 of FIG. 8. The electromagnetic shield 850 includes four portions 852-858 separated by four slits 860-866. The four portions 852-858 are coupled with a conductive region 876. A bonding pad 878, allows the electromagnetic shield 850 to be coupled to a DC voltage, for example, a ground voltage.

In the presence of a magnetic field, it will be understood that eddy currents 868-874 can be induced in the electromagnetic shield 850. Due to the four slits 860-866, it will be understood that a size (i.e., a diameter or a path length) of the closed loops eddy currents 866-874 tends to be smaller than the size of the closed loop eddy currents 812, 814 of FIG. 19. It will be understood that the reduced size of the closed loops in which the eddy currents 868-874 travel results in smaller eddy currents 868-874 and a smaller local affect on the AC magnetic field that induced the eddy current than that which results from the shield 800 of FIG. 19. Therefore, the sensitivity of a current sensor on which the Hall effect element 880 and the electromagnetic shield 850 are used is less affected by the smaller eddy currents 868-874 than the sensitivity of a current sensor using the shield 800 of FIG. 19.

Furthermore, by placing the shield 850 in relation to the Hall effect element 880 as shown, so that the slits 860-866 pass over the Hall effect element 880, it will be understood that the magnetic field associated with any one of the eddy currents 868-874, tends to form magnetic fields passing through the Hall effect element 880 in two directions, canceling over at least a portion of the area of the Hall effect element 880.

Figure 21:
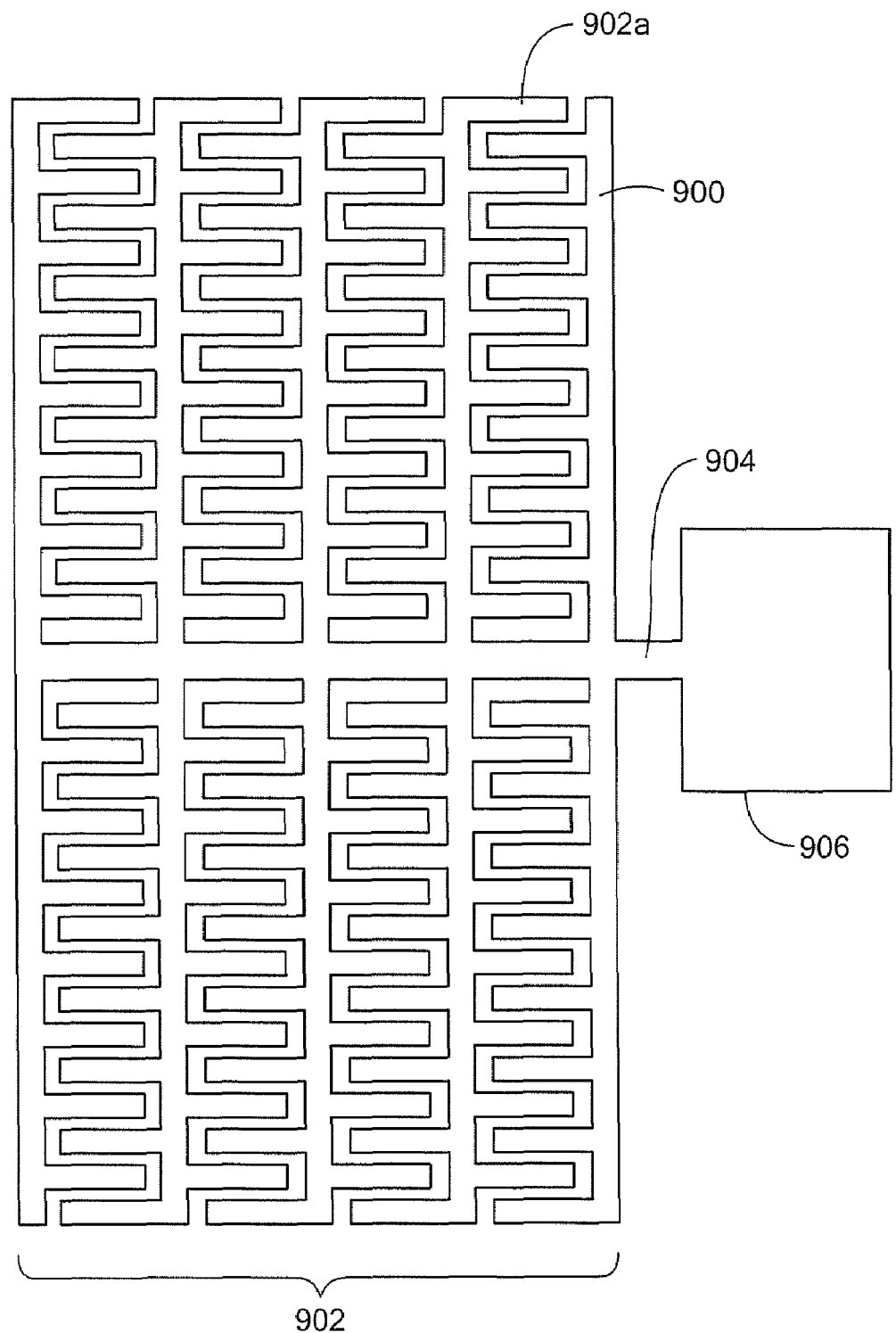
FIG. 21 is a top view of yet another electromagnetic shield that can form part of a current sensor.

Referring now to FIG. 21, an electromagnetic shield 900 can be the same as or similar to the electromagnetic shield 212 of FIG. 8. The electromagnetic shield 900 includes a shielding portion 902 having interdigitated members, of which member 902a is but one example. The interdigitated members are coupled though a conductor portion 904 to a bonding pad 906, which allows the electromagnetic shield 900 to be coupled to a DC voltage, for example, a ground voltage.

It will be recognized that the electromagnetic shield 900 is able to support eddy currents having a much smaller size (i.e., diameter of path length) than the electromagnetic shield 850 of FIG. 20 or the electromagnetic shield 800 of FIG. 19. Therefore, the electromagnetic shield 900 tends to have an even smaller negative affect on sensitivity of a current sensor than that described above.

Figure 22:
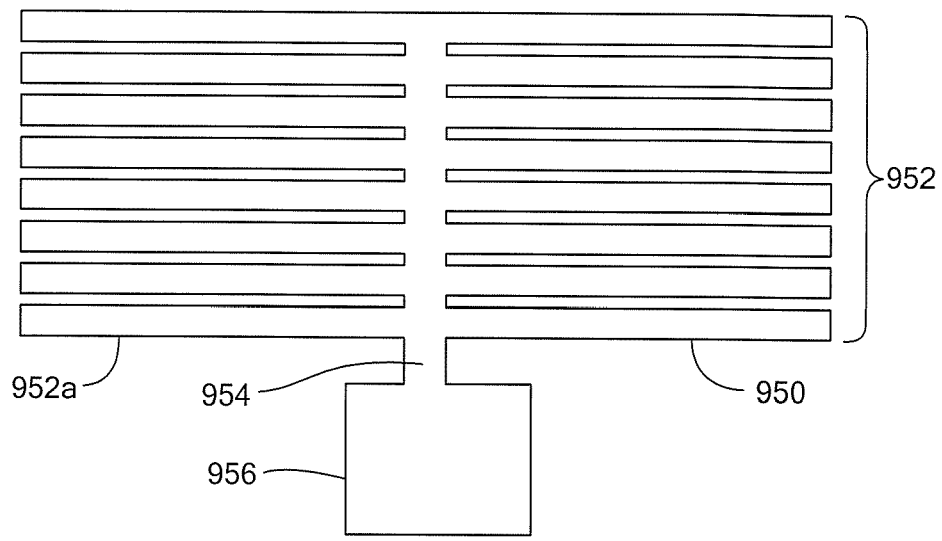
FIG. 22 is a top view of yet another electromagnetic shield that can form part of a current sensor.

Referring now to FIG. 22, an electromagnetic shield 950 can be the same as or similar to the electromagnetic shield 212 of FIG. 8. The electromagnetic shield 950 includes a shielding portion 952 having a plurality of members, of which member 952a is but one example. The members are coupled though a conductor portion 954 to a bonding pad 956, which allows the electromagnetic shield 950 to be coupled to a DC voltage, for example, a ground voltage.

Advantages of the electromagnetic shield 950 will be apparent from discussion above.

Figure 23:
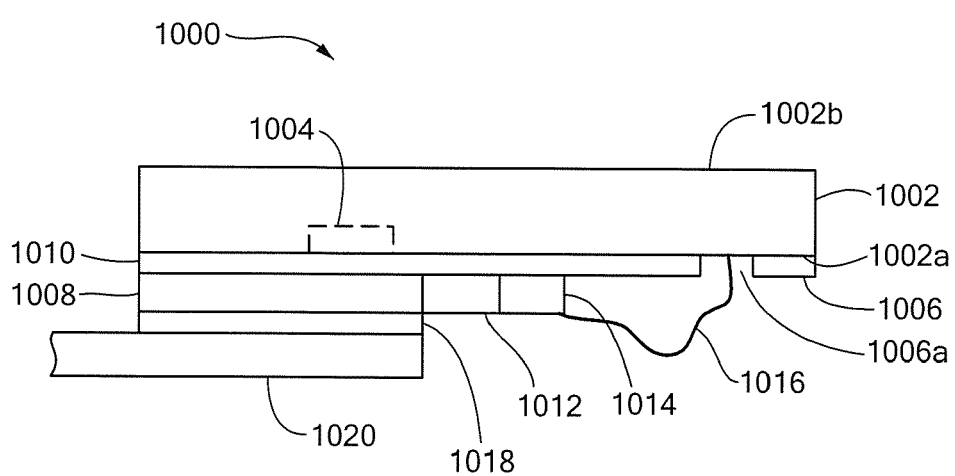
FIG. 23 is a cross section showing a layer stackup of an exemplary current sensor having one of the electromagnetic shields of FIGS. 19-22.

Referring now to FIG. 23, a side view of a portion of a current sensor 1000 includes a substrate 1002 having a first surface 1002a and a second surface 1002b. A Hall effect element 1004 is disposed on or in the first surface 1002a of the substrate 1002. An insulating layer 1006 is disposed under the first surface 1002a of the substrate 1002.

An electromagnetic shield 1008 is disposed under the insulating layer 1006. The electromagnetic shield can be the same as or similar to one of the electromagnetic shields 800, 850, 900, 950 of FIGS. 19-22, respectively. The electromagnetic shield 1008 includes a shielding portion 1100, a conductor portion 1012, and a bonding pad 1014, which can be the same as or similar to similar structures in FIGS. 19-22. A bonding wire 1016, or another bonding method, can couple the bonding pad 1014 to the first surface 1002a of the substrate 1002, and, in particular, to a metal layer (not shown) on the first surface 1002a of the substrate 1002. However, in some embodiments, this coupling is instead made via a metal layer deposited as part of the integrated circuit fabrication process, for example, a base process plus an additional metal layer, in which case, the bonding wire 1016 can be omitted.

The current sensor 1000 can also include another insulating layer 1018 disposed under the electromagnetic shield 1008. The current sensor 1000 can further include a current conductor portion 1020 disposed under the insulating layer 1018. The current conductor portion 1020 can be the same as or similar to the various current conductor portions described herein, for example, the current conductor portion 304b of FIG. 11.

While the current sensor 1000 is shown in a flip-chip arrangement, in other embodiments, the structure can be reversed to provide a non flip-chip arrangement.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims. All references cited herein are hereby incorporated herein by reference in their entirety.

What is claimed is:

1. A current sensor, comprising:
   a lead frame having a plurality of leads;
   a first current conductor portion comprising at least two of the plurality of leads;
   a substrate having first and second opposing surfaces, the first surface proximate to said first current conductor portion and the second surface distal from said first current conductor portion;
   one or more magnetic field transducers disposed on the first surface of said substrate; and
   an electromagnetic shield disposed proximate to the one or more magnetic field transducers and between the first surface of the substrate and the first current conductor portion, wherein said electromagnetic shield has at least one feature selected to reduce an eddy current induced in said electromagnetic shield.

2. The current sensor of claim 1, wherein said electromagnetic shield is substantially planar and has a shape selected to reduce a path length of a closed loop current path in said electromagnetic shield.

3. The current sensor of claim 1, wherein said electromagnetic shield comprises a slot.

4. The current sensor of claim 1, wherein said electromagnetic shield comprises:
   a central member; and
   a plurality of non-overalapping members coupled to the central member.

5. The current sensor of claim 1, wherein said electromagnetic shield comprises a plurality of interdigitated members.

6. The current sensor of claim 1, wherein a position of the at least one feature relative to said one or more magnetic field transducers is selected to reduce an affect of the eddy current upon the one or more magnetic field transducers.

7. The current sensor of claim 1, wherein each one of the leads has a bend in a direction selected to result in each one of the leads being closer to the first surface of the substrate than to the second surface of the substrate throughout a length of the lead.

8. The current sensor of claim 1, wherein said first current conductor portion comprises a coupling of the at least two of the plurality of leads and wherein said one or more magnetic field transducers are disposed proximate to said first current conductor portion.

9. The current sensor of claim 1, further comprising a second current conductor portion deposited on the first surface of the substrate, disposed proximate to the one or more magnetic field transducers, and coupled to the first current conductor portion.

10. The current sensor of claim 1, further comprising an insulating layer disposed between the first surface of the substrate and the first current conductor portion.

11. The current sensor of claim 1, wherein said substrate has at least one bonding pad coupled to a corresponding one of the plurality of leads with a bond wire.

12. The current sensor of claim 1, wherein said substrate is coupled to said lead frame with a selected one of a solder ball, a gold bump, a eutectic and high lead solder bump, a no-lead solder bump, a gold stud bump, a polymeric conductive bump, an anisotropic conductive paste, or a conductive film coupled to a corresponding one of the plurality of leads.

13. The current sensor of claim 1, wherein at least a portion of said first current conductor portion has a T-shaped cross section.

14. The current sensor of claim 1, wherein at least a portion of said first current conductor portion has a rectangular cross section having a minimum dimension less than a thickness of said lead frame.

15. The current sensor of claim 1, further comprising at least one amplifier disposed on said substrate.

16. The current sensor of claim 1, further comprising a shunt conductor portion comprising a coupling of the at least two of the plurality of leads.

17. The current sensor of claim 16, wherein said first current conductor portion and said shunt conductor portion are adapted to pass respective portions of a current and wherein said shunt conductor portion has a size and a shape selected to provide a selected resistance, which is selected to pass a selected portion of the current.

18. The current sensor of claim 1, wherein the substrate and the lead frame are relatively disposed in a flip chip arrangement.

19. A current sensor, comprising:
a lead frame having a plurality of leads;
a substrate having first and second opposing surfaces;
one or more magnetic field transducers disposed on the first surface of said substrate; and
an electromagnetic shield disposed proximate to the one or more magnetic field transducers, wherein said electromagnetic shield has at least one feature selected to reduce an eddy current induced in said electromagnetic shield.

20. The current sensor of claim 19, wherein said electromagnetic shield is substantially planar and has a shape selected to reduce a path length of a closed loop current path in said electromagnetic shield.

21. The current sensor of claim 19, wherein said electromagnetic shield comprises a slot.

22. The current sensor of claim 19, wherein said electromagnetic shield comprises:
a central member; and
a plurality of non-overalapping members coupled to the central member.

23. The current sensor of claim 19, wherein said electromagnetic shield comprises a plurality of interdigitated members.

24. The current sensor of claim 19, wherein a position of the at least one feature relative to said one or more magnetic field transducers is selected to reduce an affect of the eddy current upon the one or more magnetic field transducers.

25. The current sensor of claim 19, wherein the substrate and the lead frame are relatively disposed in a flip chip arrangement.

* * * * *

UNITED STATES PATENT AND TRADEMARK OFFICE
CERTIFICATE OF CORRECTION

PATENT NO. : 7,598,601 B2
APPLICATION NO. : 12/171651
DATED : October 6, 2009
INVENTOR(S) : William P. Taylor et al.

It is certified that error appears in the above-identified patent and that said Letters Patent is hereby corrected as shown below:

On title page, Item (75) Abstract, line 12, delete "flip-chap" and replace with --flip-chip--.

Col. 4, line 24, delete "though" and replace with --through--.

Col. 4, line 41, delete "having maximum" and replace with --having a maximum--.

Col. 6, line 5, delete "though" and replace with --through--.

Col. 6, line 25, delete "though" and replace with --through--.

Col. 7, line 7, delete "element" and replace with --elements--.

Col. 7, line 32, delete "though" and replace with --through--.

Col. 7, line 40, delete "element" and replace with --elements--.

Col. 7, line 54, delete "though" and replace with --through--.

Col. 8, line 61, delete "though" and replace with --through--.

Col. 9, line 11, delete "is" and replace with --in--.

Col. 10, line 26, delete "though" and replace with --through--.

Col. 10, line 45, delete "though" and replace with --through--.

Col. 10, line 49, delete "though" and replace with --through--.

Col. 12, line 26, delete "portion" and replace with --portions--.

Col. 12, line 49, delete "portion" and replace with --portions--.

Col. 13, line 2, delete "embodiment the" and replace with --embodiment, the--.

Col. 13, line 4, delete "describe" and replace with --described--.

Col. 13, line 50, delete "first current conductor portion are" and replace with --first current conductor portion 304a are--.

UNITED STATES PATENT AND TRADEMARK OFFICE
CERTIFICATE OF CORRECTION

PATENT NO. : 7,598,601 B2
APPLICATION NO. : 12/171651
DATED : October 6, 2009
INVENTOR(S) : William P. Taylor et al.

It is certified that error appears in the above-identified patent and that said Letters Patent is hereby corrected as shown below:

Col. 13, line 56, delete "though" and replace with --through--.

Col. 14, lines 25-26, delete "variety materials," and replace with --variety of materials,--.

Col. 14, line 28, delete "insulting" and replace with --insulating--.

Col. 14, line 28, delete "variety materials" and replace with --variety of materials,--.

Col. 14, line 32, delete "insulting" and replace with --insulating--.

Col. 14, line 32, delete "variety materials," and replace with --variety of materials,--.

Col. 14, line 34, delete "insulting" and replace with --insulating--.

Col. 14, line 35, delete "variety materials," and replace with --variety of materials,--.

Col. 14, line 36, delete "insulting" and replace with --insulating--.

Col. 14, line 37, delete "variety materials," and replace with --variety of materials,--.

Col. 14, line 48, delete "though" and replace with --through--.

Col. 15, line 15, delete "substrate is 306" and replace with --substrate 306--.

Col. 15, lines 35-36, delete "portions 304b." and replace with --portion 304b.--.

Col. 16, line 18, delete "insulting" and replace with --insulating--.

Col. 16, line 32, delete "insulting" and replace with --insulating--.

Col. 18, line 11, delete "leads 502c and 502d shown" and replace with --leads 502c and 502d are shown--.

Col. 18, line 47, delete "bumps 540a, 504b" and replace with --bumps 504a, 504b--.

Col. 19, line 41, delete "though" and replace with --through--.

Col. 20, line 17, delete "though" and replace with --through--.

UNITED STATES PATENT AND TRADEMARK OFFICE
CERTIFICATE OF CORRECTION

PATENT NO. : 7,598,601 B2
APPLICATION NO. : 12/171651
DATED : October 6, 2009
INVENTOR(S) : William P. Taylor et al.

It is certified that error appears in the above-identified patent and that said Letters Patent is hereby corrected as shown below:

Col. 21, line 17, delete "current sensor of 500" and replace with --current sensor 500--.

Col. 22, line 1, delete "two substrate 656, 666." and replace with --two substrates 656, 666.--.

Col. 22, line 17, delete ", and are shown" and replace with --are shown--.

Col. 22, line 36, delete "though" and replace with --through--.

Col. 24, line 39, delete "current" and replace with --currents--.

Col. 25, line 33, delete "though" and replace with --through--.

Col. 25, line 48, delete "though" and replace with --through--.

Col. 25, line 63, delete "shielding portion 1100," and replace with --shielding portion 1010,--.

Col. 28, line 4, delete "flip chip" and replace with --flip-chip--.

Col. 28, line 35, delete "flip chip" and replace with --flip-chip--.

Signed and Sealed this

Twenty-ninth Day of December, 2009

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,598,601 B2 | Page 1 of 1 |
| APPLICATION NO. | : 12/171651 | |
| DATED | : October 6, 2009 | |
| INVENTOR(S) | : William P. Taylor et al. | |

It is certified that error appears in the above-identified patent and that said Letters Patent is hereby corrected as shown below:

Delete FIG. 23 and replace with FIG. 23 below.

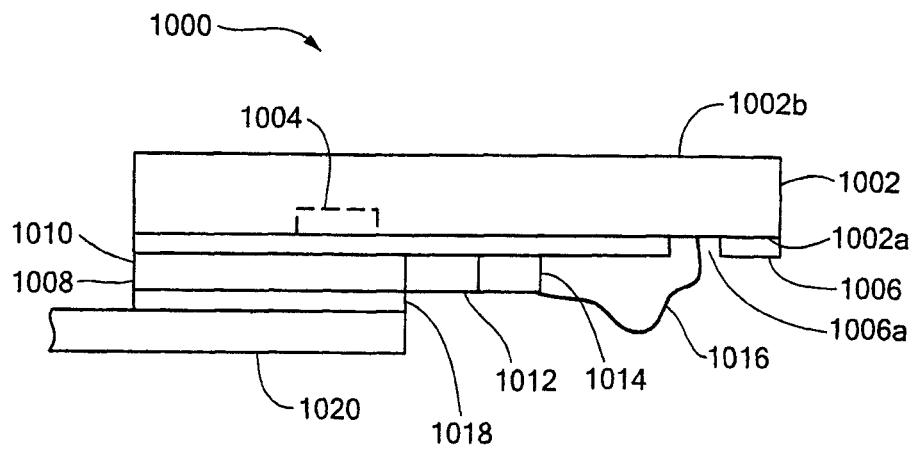

*FIG. 23*

Signed and Sealed this
Sixth Day of September, 2011

David J. Kappos
*Director of the United States Patent and Trademark Office*